(12) United States Patent
Takeuchi et al.

(10) Patent No.: US 6,864,620 B2
(45) Date of Patent: Mar. 8, 2005

(54) MATRIX TYPE ACTUATOR

(75) Inventors: Yukihisa Takeuchi, Nishikamo-Gun (JP); Hiroyuki Tsuji, Nagoya (JP); Kazumasa Kitamura, Itinomiya (JP); Nobuo Takahashi, Owariasahi (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/011,259

(22) Filed: Dec. 5, 2001

(65) Prior Publication Data

US 2003/0001454 A1 Jan. 2, 2003

Related U.S. Application Data

(63) Continuation-in-part of application No. 09/952,483, filed on Sep. 12, 2001, now abandoned, and a continuation-in-part of application No. 09/900,742, filed on Jul. 6, 2001, now Pat. No. 6,699,018.

(30) Foreign Application Priority Data

| Dec. 22, 2000 | (JP) | ....................... 2000-391715 |
| Mar. 1, 2001 | (JP) | ....................... 2001-056740 |
| Apr. 6, 2001 | (JP) | ....................... 2001-108986 |
| Jun. 22, 2001 | (JP) | ....................... 2001-189718 |

(51) Int. Cl.[7] ............................................. H01L 41/08
(52) U.S. Cl. ..................... 310/334; 310/328; 310/366
(58) Field of Search ................................. 310/328, 334, 310/366

(56) References Cited

U.S. PATENT DOCUMENTS

| 5,681,410 | A | * | 10/1997 | Takeuchi et al. .......... 156/89.15 |
| 5,745,278 | A | * | 4/1998 | La Fiandra ................. 359/224 |
| 5,938,612 | A | * | 8/1999 | Kline-Schoder et al. .... 600/459 |
| 6,066,911 | A | * | 5/2000 | Lindemann et al. ... 310/323.02 |
| 6,140,749 | A | * | 10/2000 | Nakatani .................... 310/366 |
| 6,222,303 | B1 | * | 4/2001 | Nakamura et al. .......... 310/328 |
| 6,278,223 | B1 | * | 8/2001 | Sasaki et al. ............... 310/328 |
| 6,337,532 | B1 | * | 1/2002 | Johansson et al. ..... 310/323.02 |
| 6,341,408 | B2 | * | 1/2002 | Bureau et al. ............. 29/25.35 |
| 6,618,943 | B2 | * | 9/2003 | Ashe et al. ................. 29/890.1 |

FOREIGN PATENT DOCUMENTS

| EP | 0 936 684 A1 | 8/1999 |
| JP | 60-90770 | 5/1985 |
| JP | 08-156251 | 6/1996 |
| JP | 08-309972 | 11/1996 |
| JP | 2001-047632 | 2/2001 |

* cited by examiner

Primary Examiner—Mark Budd
(74) Attorney, Agent, or Firm—Burr & Brown

(57) ABSTRACT

A matrix type piezoelectric/electrostrictive (PIE) actuator includes a plurality of piezoelectric/electrostrictive elements, each including a piezoelectric/electrostrictive body and at least one pair of electrodes formed on a ceramic substrate. The matrix type P/E actuator is activated by displacement of the piezoelectric/electrostrictive bodies. The piezoelectric/electrostrictive elements are joined to the ceramic substrate as respective unified bodies, and are two-dimensionally arranged independently from each other. The piezoelectric/electrostrictive actuator provides a greater displacement with a lower voltage, a high responsive speed, and a greater generating force, as well as enhancing the mounting ability and the integration. A method for manufacturing such a matrix type P/E actuator is also disclosed.

14 Claims, 25 Drawing Sheets

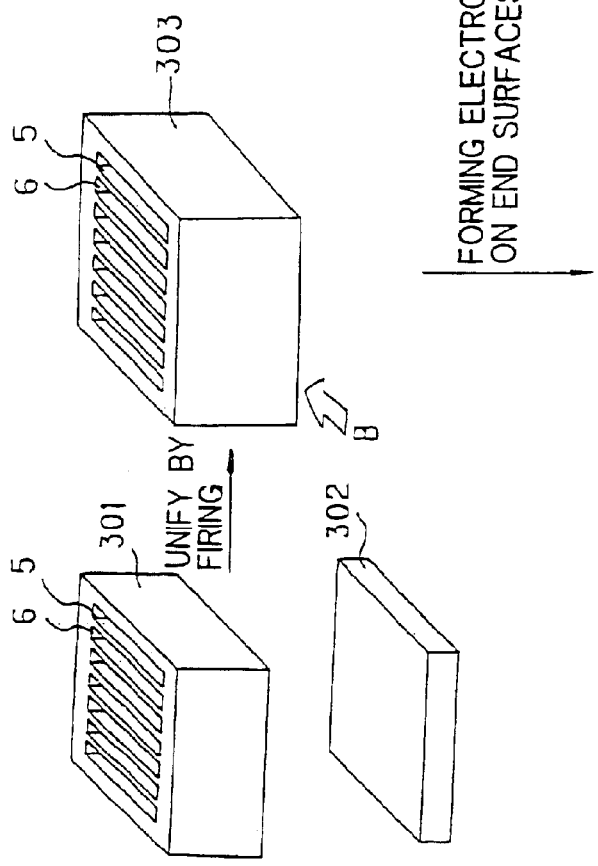
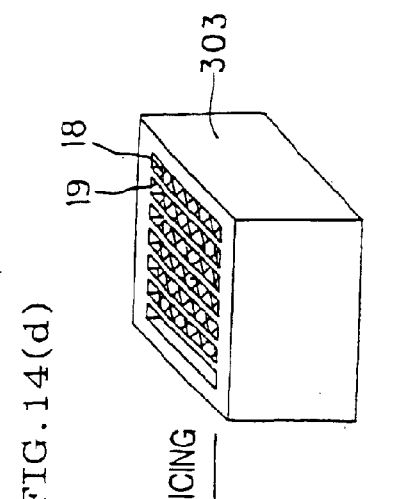
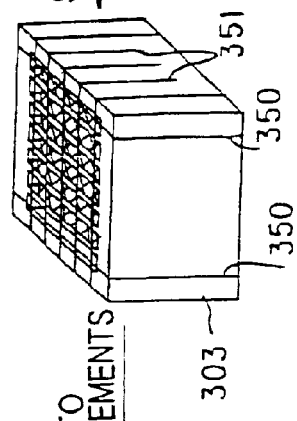
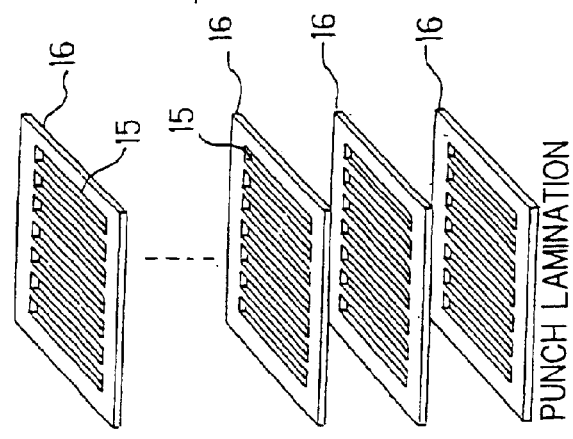
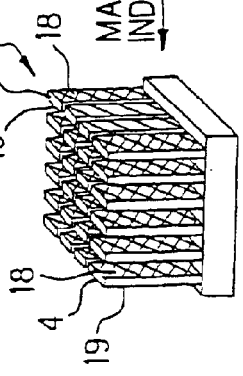

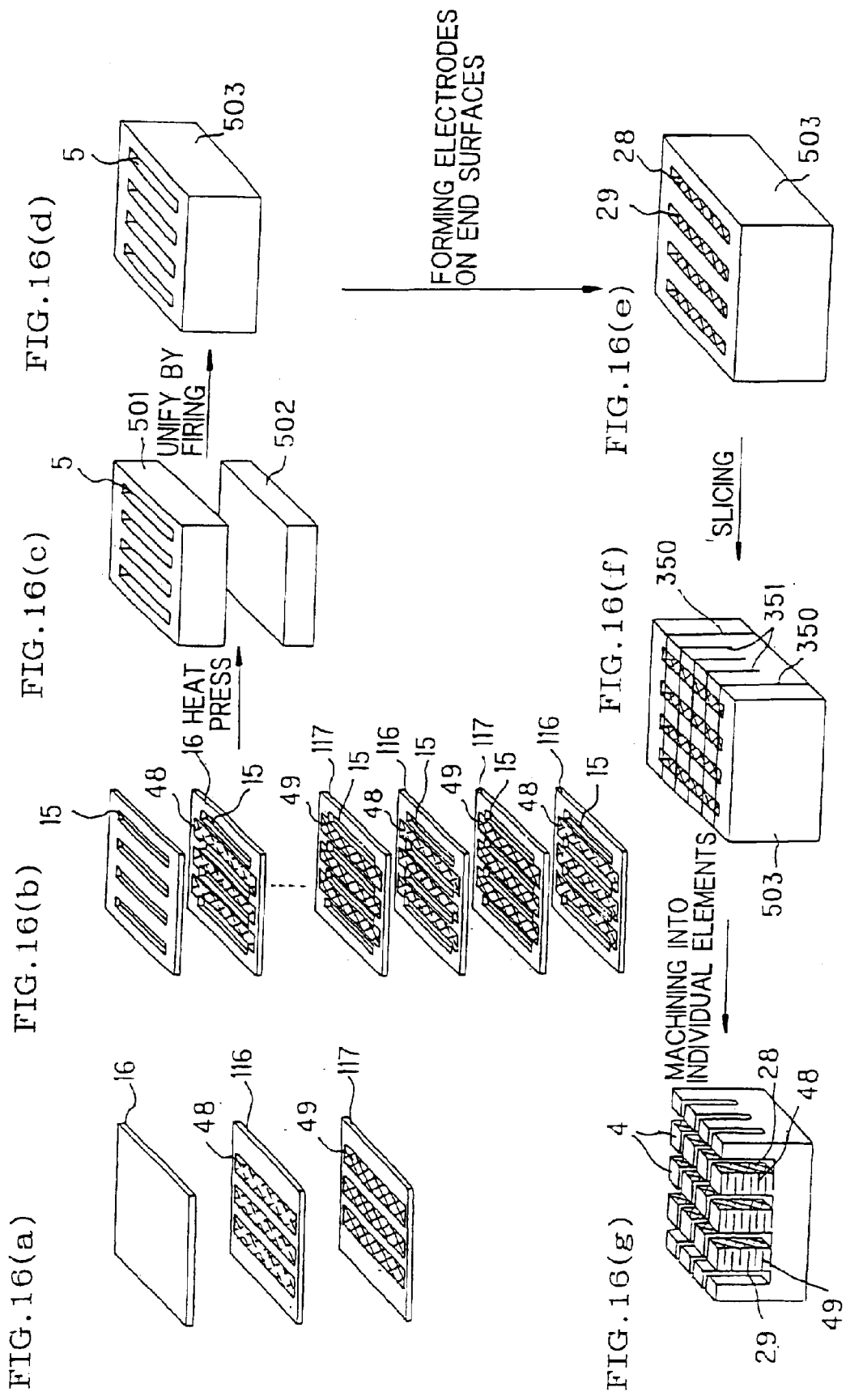

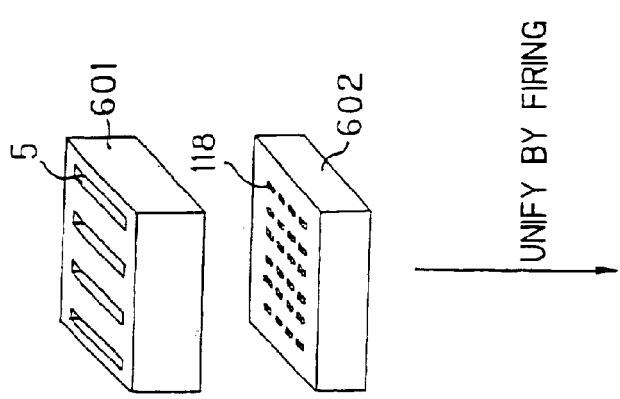
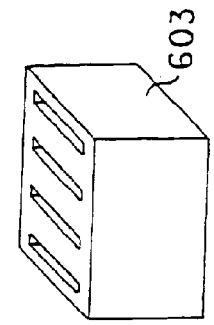
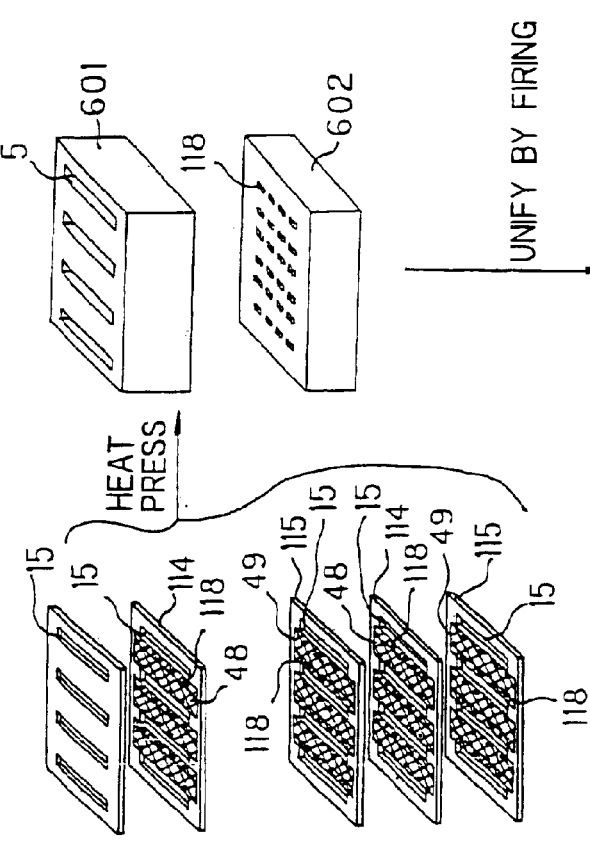
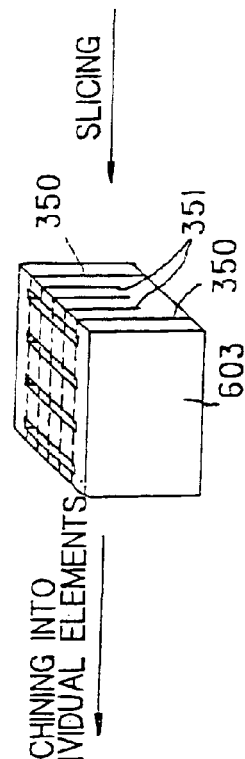
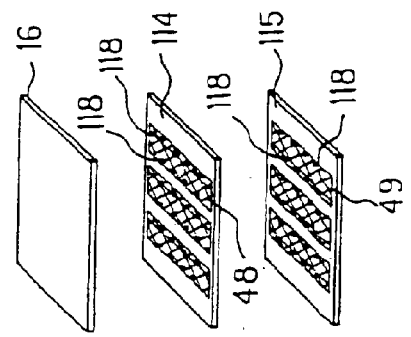
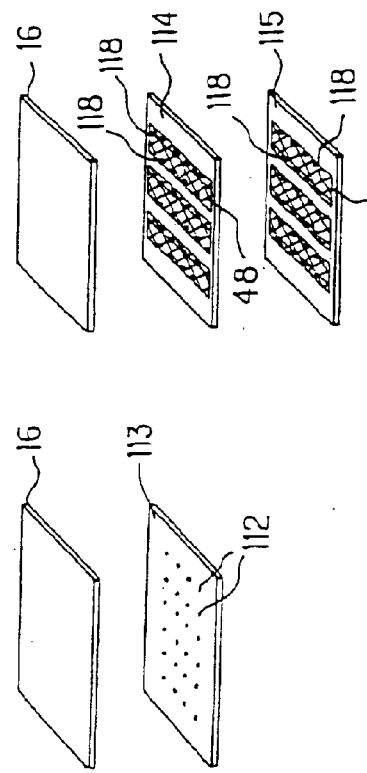
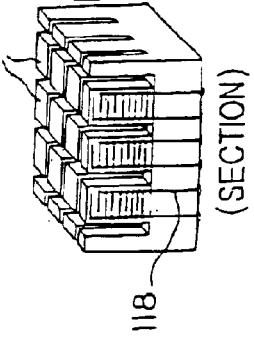

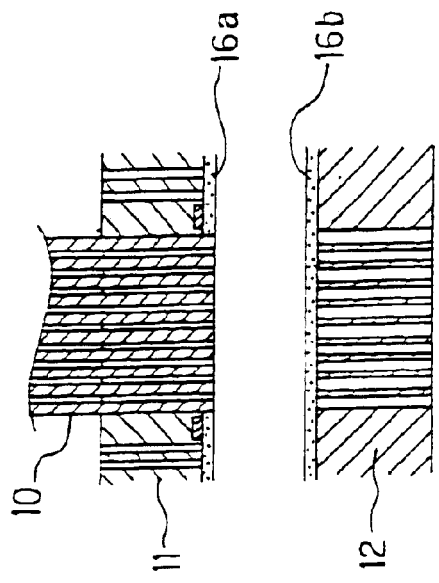
FIG.18(a)
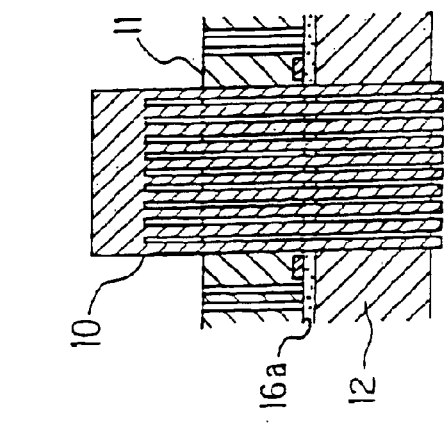
FIG.18(b)
FIG.18(c)
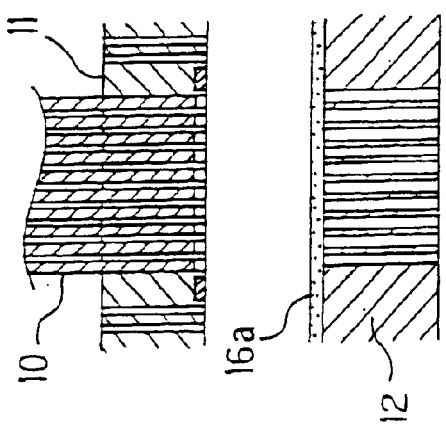
FIG.18(d)
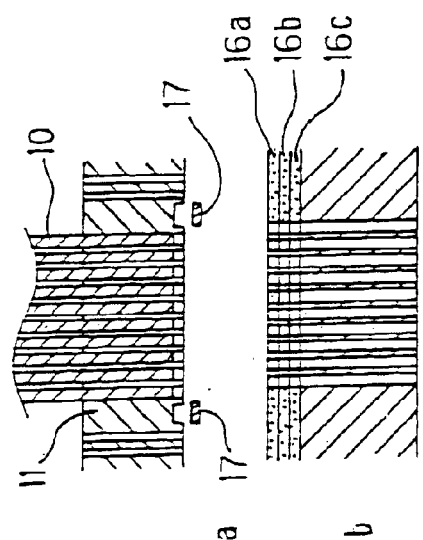
FIG.18(e)
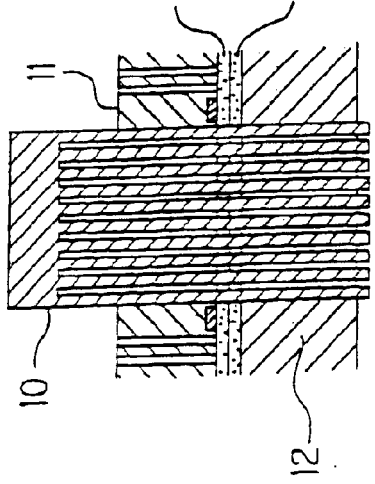

US 6,864,620 B2

1

MATRIX TYPE ACTUATOR

CROSS REFERENCE TO RELATED APPLICATIONS

This application is a continuation in part of U.S. patent application Ser. No. 09/952,483 filed on Sep. 12, 2001, now abandoned, and is a continuation in part of U.S. patent application Ser. No. 09/900,742 filed on Jul. 6, 2001, now U.S. Pat. No. 6,699,018.

BACKGROUND OF THE INVENTION AND RELATED ART

The present invention relates to a matrix type piezoelectric/electrostrictive (P/E) actuator, more specifically, to a matrix type PE actuator which may be used in an optical modulator, an optical switch, an electric switch, a micro relay, micro valve, a conveyor apparatus, an image display apparatus such as a display, a projector, and the like, an image drawing apparatus, a micro pump, a droplet ejecting apparatus, a micro mixing apparatus, a micro stirring apparatus, a micro reactor, and the like. The matrix type P/E actuator is provided with a higher generating force and a greater displacement; and preferably is capable of showing such a function to objectives as pressing, deforming, moving, hammering (giving an impact), mixing, or the like by expressing expansion/contraction displacement and/or vibration in a direction perpendicular to the main surface of a ceramic substrate owing to transverse effect of the electric field induced strain of the piezoelectric/electrostrictive element. The present invention also relates to a method for manufacturing such an actuator.

In recent years, a displacement controlling element which permits adjusting the length of a optical path and the spatial position in the order of a sub micron is required in the field of the optics, precision machining engineering, semiconductor manufacturing engineering and so on. For this purpose, a piezoelectric/electrostrictive actuator, which utilizes a strain resulting from the reverse piezoelectric effect or the electrostrictive effect induced by applying an electric field to a ferroelectric material or an antiferroelectric material, has been developed. Compared with the conventional electromagnetic elements, such as servomotors, pulse motors, and so on, such a displacement control element with the aid of the strain induced by the applied electric field has characteristic features such that the micro displacement can be easily attained, and a high efficiency in converting the electric energy to the mechanical energy or vice versa provides a reduction in the consumption of an electric power. Furthermore, an extremely high precision in assembling the components of the displacement control element provides small and lightweight products. Thus, it is considered that the applicable field thereof will increase continuously.

In an optical switch, for instance, such a piezoelectric/electrostrictive element is normally used to switch transmission channels for an incident light. An example of such an optical switch is shown in FIGS. 2(a) and (b). The optical switch 200 shown in FIGS. 2(a) and (b) comprises a light transmitting member 201, a light path changing member 208 and an actuator member 211. In a more detailed description, the light transmitting member 201 includes a light reflecting plane 101 disposed in a part of a surface facing the light path changing member 208, and light transmitting channels 202, 204 and 205 directed in three different directions from the light reflecting plane 101, and the light path changing member 208 includes a transparent light incident member

2

209 movably disposed in the vicinity of the light reflecting plane 101 in the light transmitting member 201 and a light reflecting element 210 for providing a total reflection. Moreover, the actuator member 211 has a mechanism, which is displaced by an applied external signal and then transmits the displacement to the light path changing member 208.

In the optical switch 200, the actuator member 211 is activated by an external signal, e.g., an applied voltage, as shown in FIG. 2(a), and then the light path changing member 208 separates from the light transmitting member 201 by the displacement of the actuator member 211, so that light 221 incident in the light transmitting channel 202 of the light transmitting member 201 is reflected in the total reflection at the light reflecting plane 101 in the light transmitting member 201 without any transmission thereof, and is transferred to one of the light transmitting channels 204 on the exit side.

On the other hand, if the actuator member 211 is changed into the non-acting state from this state, the position of the actuator member 211 is turned to the initial position, as shown in FIG. 2(b), and the light incident member 209 in the light path changing member 208 comes into contact with the light transmitting member 201 within the distance less than the wavelength of light, so that the light 221 incident to the light transmitting channel 202 is transmitted from the light transmitting member 201 to the light incident member 209 with the action thereof, and then passes through the light incident member 209. The light 221 passed through the light incident member 209 arrives at the light reflecting element 210, and is transmitted to another light transmitting channel 205 on the exit side on which the light reflected by the light reflecting surface 101 of the light transmitting member 201 proceeds owing to the reflection by the light reflecting surface 102 of this light reflecting member 209.

As the actuator member of an optical switch having such a light path changing function, a piezoelectric/electrostrictive element is preferably used. In particular, in the design of a matrix type switch for switching between several channels, a piezoelectric/electrostrictive actuator including a plurality of piezoelectric/electrostrictive elements of a unimorph or bimorph type (hereafter, being referred to as bending displacement elements) is preferably employed, as disclosed in Japanese Patent No. 2693291 specification. The bending displacement element is constituted by a vibrating plate and piezoelectric/electrostrictive elements, and can provide a greater displacement, in proportion with the length of the piezoelectric/electrostrictive elements, since a slight expansive/contractive strain of the piezoelectric/electrostrictive elements induced by an applied electric field is converted into a bending displacement in the bending mode. However, since the strain was converted in such a way, the stress arising directly from the strain of the piezoelectric/electrostrictive elements could not be directly used, and therefore it was very difficult to increase the magnitude of the generated stress. Moreover, it was also difficult to increase the responsive speed satisfactorily, since the resonance frequency inevitably decreased with the increase of the length of the elements.

Meanwhile, in attaining an enhancement in the performance of an optical switch 200, firstly there is a requirement of increasing the ON/Off ratio (contrast). In this case, it is important to reliably perform the contact/separate action between the light path changing member 208 and the light transmitting member 201, and therefore the actuator member preferably provides a greater stroke, i.e., a greater displacement. Secondly, there is a requirement of reducing the power loss due to the switching. In this case, it is important to increase the area of the light path changing member 208 together with the increase in the effective area of the light transmitting member 201 coming into contact therewith. Since, however, such an increase in the contact area causes a reduction in the reliability of separation, an actuator generating a greater force is necessary. Hence, in enhancing the performance of such an optical switch, it is desirable to provide a piezoelectric/electrostrictive actuator including an actuator generating a greater displacement together with a greater force.

It is preferable that the individual piezoelectric/electrostrictive elements are constituted so as to be independent of each other. The independency mentioned herein implies that the generated displacement and the stress resulting therefrom in the respective elements does not interfere with each other, i.e., constrain each other in these elements. For instance, the piezoelectric/electrostrictive actuator 145 shown in FIG. 3 provides a bending displacement due to the activation of piezoelectric/electrostrictive elements 178, as shown in the sectional view of FIG. 4. Each piezoelectric/electrostrictive element 178 is mechanically independent of the adjacent piezoelectric/electrostrictive element with the aid of the rigidity of partition walls 143. However, a substrate 144 is formed in a unified element, and vibrating plates to which the piezoelectric/electrostrictive elements 178 act are also a continuous element. Accordingly, although the respective adjacent piezoelectric/electrostrictive elements are independent of each other by the partition walls 143, a tensile or compressive stress resulting from the action of the piezoelectric/electrostrictive elements 178 provides a certain influence between the piezoelectric/electrostrictive elements. On the other hand, in the piezoelectric/electrostrictive elements 155 shown in the sectional view of FIG. 5, a side walls 219 carrying a vibrating plates 218 is separated from the adjacent side walls 219, thereby providing no interaction with the adjacent elements.

Moreover, as another embodiment, actuators used for an ink jet head, which are disposed in a straight line in conjunction with pressurizing chambers disposed in a straight line, are disclosed in FIG. 2 of JP-A-60-90770. The actuators are formed not by the above-mentioned bending displacement elements, but by piezoelectric/electrostrictive elements, which directly utilize the strain of the piezoelectric/electrostrictive elements. In the actuators, however, electrodes are formed on the upper and lower activation surfaces of the piezoelectric/electrostrictive elements, and in general the piezoelectric constant d33 representing the longitudinal effect of the electric field induced strain is greater than the piezoelectric constant d31 representing the transversal effect of the electric field induced strain. Nevertheless, it was difficult to obtain a greater amount of displacement with a smaller applied voltage, since the distance between the electrodes is large. On the other hand, an actuator used by applying a voltage to the piezoelectric plate in the direction of the thickness thereof is disclosed in FIG. 5 thereof. In this actuator, there is used singly a single piezoelectric element produced by forming merely electrodes on a piezoelectric plate. Moreover, the piezoelectric element disclosed in JP-A-60-90770 is produced by processing the resultant with cutting using diamond saw, and therefore there is a problem in that the element is not free from damages inherently formed by the machining.

In any way, there has been so far no proposal of providing such a piezoelectric/electrostrictive actuator that piezoelectric/electrostrictive elements having little damage suffered in the manufacturing with both a greater displacement and a high generating force are arranged in the form of a two dimensional matrix, and are unified with the substrate into one body as well.

SUMMARY OF THE INVENTION

The present invention has been completed, taking the above-mentioned matters into account, and the object of the present invention is to provide a piezoelectric/electrostrictive actuator which ensures generating a greater displacement and a high generating force with a low voltage applied and a high responsive speed, and is so excellent in the mounting as a high degree of integration is feasible and can preferably be applied to an optical modulator, an optical switch, an electric switch, a micro relay, micro valve, a conveyor apparatus, an image display apparatus such as a display, projector, and the like, an image drawing apparatus, a micro pump, a droplet ejecting apparatus, a micro mixing apparatus, a micro stirring apparatus, a micro reactor, and the like; and preferably being capable of showing such a function to objectives as pressing, deforming, moving, hammering (giving an impact), mixing, or the like by expressing expansion/contraction displacement and/or vibration. The object of the present invention is also to provide a method for manufacturing such piezoelectric/electrostrictive actuator. After many investigations on the piezoelectric/electrostrictive actuators, it is found that the objects can be solved with a matrix type P/E actuator described below.

In accordance with the present invention, there is provided a matrix type piezoelectric/electrostrictive actuator in which a plurality of piezoelectric/electrostrictive elements each consisting of a piezoelectric/electrostrictive body and at least one pair of electrodes are formed on a thick ceramic substrate, said actuator being activated by the displacement of said piezoelectric/electrostrictive bodies, wherein said piezoelectric/electrostrictive elements are jointed to said ceramic substrate into respective unified bodies, and are two-dimensionally arranged independently of each other.

The actuator according to the present invention, in particular, comprises two types of actuators. A first matrix type P/E actuator according to the present invention is an actuator in which the piezoelectric/electrostrictive element is formed by disposing piezoelectric/electrostrictive body vertically on the ceramic substrate and the electrodes are formed on the side surfaces of said body. More preferably, the electrodes are formed on the side surfaces including the long side of the cross section of the piezoelectric/electrostrictive body, in such a manner that said cross section of the piezoelectric/electrostrictive body in the piezoelectric/electrostrictive element shows a parallelogram shape in the cross section parallel direction to the substrate. In the first matrix type P/E actuator, it is desirable that the piezoelectric/electrostrictive elements are expanded/contracted in the vertical direction to the main surface of said ceramic substrate due to the transverse effect of the electric field induced strain. Moreover, it is preferable that the condition of crystal grains in the wall surfaces of the piezoelectric/electrostrictive bodies of the piezoelectric/electrostrictive elements, where the electrodes is formed on the wall surfaces, is that the crystal grains suffering the transgranular fracture inside the grain are 1% or less, and it is preferable that the degree of profile for the surfaces of the piezoelectric/electrostrictive bodies in the piezoelectric/electrostrictive elements is approximately 8 $\mu$m or less. It is also preferable that the surface roughness Rt of the wall surfaces of the piezoelectric/electrostrictive bodies in the piezoelectric/electrostrictive element is approximately 10 $\mu$m or less.

The second matrix type P/E actuator according to the present invention is an actuator according wherein the piezoelectric/electrostrictive elements are formed on the ceramic substrate by alternately interleaving stratiform piezoelectric/electrostrictive bodies into stratiform electrodes. In the second matrix type P/E actuator, it is preferable that the piezoelectric/electrostrictive elements are expanded/contracted in the vertical direction to the main surface of the ceramic substrate due to the longitudinal effect of the electric field induced strain. And it is preferable that the thickness of one layer of the piezoelectric/electrostrictive body in the piezoelectric/electrostrictive elements is 100 µm or less. It is also preferable that the number of layers forming said piezoelectric/electrostrictive body in the piezoelectric/electrostrictive elements is 10 to 200.

In the first and second matrix type P/E actuators, it is preferable that the wall portions are formed between the adjacent piezoelectric/electrostrictive elements. In the first and second matrix type P/E actuators, it is preferable that the piezoelectric/electrostrictive body is formed of a material among the piezoelectric ceramics, electrostrictive ceramics, and antiferroelectric ceramics or a composite material which is selectable of the ceramic material and piezoelectric polymer. It is further preferable that the ceramic substrate is formed of the same material as the piezoelectric/electrostrictive body forming said piezoelectric/electrostrictive elements. Moreover, it is preferable that electrode terminals are disposed on the surface opposite to the surface on which the piezoelectric/electrostrictive elements are arranged on the ceramic substrate, and the electrodes and the electrode terminals are wired to each other via through holes or via holes formed in the ceramic substrate.

According to the present invention, furthermore, there is provided a method for manufacturing a matrix type P/E actuator, in which a plurality of piezoelectric/electrostrictive elements consisting of a piezoelectric/electrostrictive body and at least one pair of electrodes are two-dimensionally arranged on a thick ceramic substrate, wherein the method comprising: a step A for obtaining ceramic green lamination structure having through apertures, wherein a plurality of ceramic green sheets including piezoelectric/electrostrictive material as a main component are prepared, said ceramic green sheets are machined with a punch and a die to form apertures at predetermined positions and laminated, and thus the through apertures are formed by connecting said apertures to each other; a step B for preparing ceramic green substrates to be a ceramic substrate at a later stage; a step C for obtaining a sintered lamination structure by laminating the ceramic green lamination structure and the ceramic green substrate, and then by sintering and unifying them; and a step D for slicing the sintered lamination structure at the portion corresponding to the ceramic green lamination structure obtained at least said step A; wherein said method further comprises a process for forming a plurality of independent piezoelectric/electrostrictive elements on the ceramic substrate.

In the method for manufacturing the matrix type P/E actuator according to the present invention, the step A includes; a first substep for forming first apertures in a first ceramic green sheet with the punch, a second substep for raising the first ceramic green sheet in contact with a stripper in the state of not withdrawing the punch from the first aperture, a third substep for raising the punch in such a manner that the front ends of the punch are withdrawn slightly from the lowest part of the raised first green sheet, a fourth substep for forming second apertures in a second ceramic green sheet with the punch, a fifth substep for raising the second green sheet together with the first ceramic green sheet, and a sixth substep for raising the punch in such a manner that the front ends of the punch are withdrawn slightly from the lowest part of the second ceramic green sheet, whereby the lamination is carried out by repeating the fourth substep to sixth substep, and then the ceramic green lamination structure having through apertures formed by the connection of the apertures can be obtained.

Furthermore, it is preferable that a step for filling the through apertures of said sintered lamination structure at the portion corresponding to said ceramic green lamination structure with a filler is interposed between said step C and said step D. The disclosures of the U.S. patent application Ser. No. 09/900,742 filed on Jul. 6, 2001, now U.S. Pat. No. 6,699,018, and U.S. patent application Ser. No. 09/952,483 filed on Sep. 12, 2001 are herein incorporated by reference in their entirety.

BRIEF DESCRIPTION OF THE DRAWINGS

FIG. 2(a) shows the activated state in the application of an optical switch.

FIG. 6(a) is a perspective view of a part of the actuator in application of a micro valve.

FIG. 7(a) is a plan view of an optical modulator in the application.

FIGS. 14(a) to (f) are drawings for explaining a manufacturing method for a matrix type P/E actuator according to the present invention.

FIGS. 16(a) to (g) are drawings for explaining still another manufacturing method for a matrix type P/E actuator according to the present invention.

FIGS. 17(a) to (g) are drawings for explaining still another manufacturing method for a matrix type P/E actuator according to the present invention.

FIGS. 18(a) to (e) are drawings for explaining the process of simultaneous punching and laminating ceramic green sheets in the method for manufacturing the matrix type P/E actuator according to the present invention, where FIG. 18(a) shows a preparation step of placing a first ceramic green sheet on a die, FIG. 18(b) shows a step of punching the first ceramic green sheet, FIG. 18(c) shows a preparation step of placing a second ceramic green sheet thereon, FIG. 18(d) shows a step of punching the second ceramic green sheet, and FIG. 18(e) shows a punching completing step in which the laminated green sheets are removed by a stripper after all the sheets are punched and laminated.

FIG. 19(a) shows a vertical section viewed in the direction B in FIG. 14(c) and FIG. 19(b) shows a magnified section of part M in FIG. 19(a).

FIG. 20(a) shows a section of an element to be machined, viewed from the side thereof.

DETAILED DESCRIPTION OF THE INVENTION

In the following, various embodiments for the matrix type P/E actuator according to the present invention will be concretely described. However, the present invention is not restricted to these embodiments, and various alterations, revisions and modifications are possible without departing from the scope of the present invention. Here, the matrix type P/E actuator according to the present invention belongs to a piezoelectric/electrostrictive actuator, and therefore it is an actuator in which an electric field induced strain is utilized. However, the matrix type P/E actuator is not restricted to an actuator in which the piezoelectric effect of generating a strain substantially proportional to an applied electric field or the electro-strictive effect of generating a strain substantially proportional to the square of an applied electric field is utilized in a narrow sense, but it also includes an actuator in which a phenomenon of a polarization reversal found in ferroelectric materials, or a transition between the antiferroelectric phase and the ferroelectric phase found in antiferroelectric materials, or the like is utilized. Moreover, it is also optional as for whether or not the polarization treatment should be carried out. This is appropriately determined on the basis of the nature of the material for piezoelectric/electrostrictive body of piezoelectric/electrostrictive elements forming the piezoelectric/electrostrictive actuator. Accordingly, in the present specification, it should be assumed that the materials are intended for the treatment of polarization, when it is said that the polarization treatment is carried out.

Figure 1:
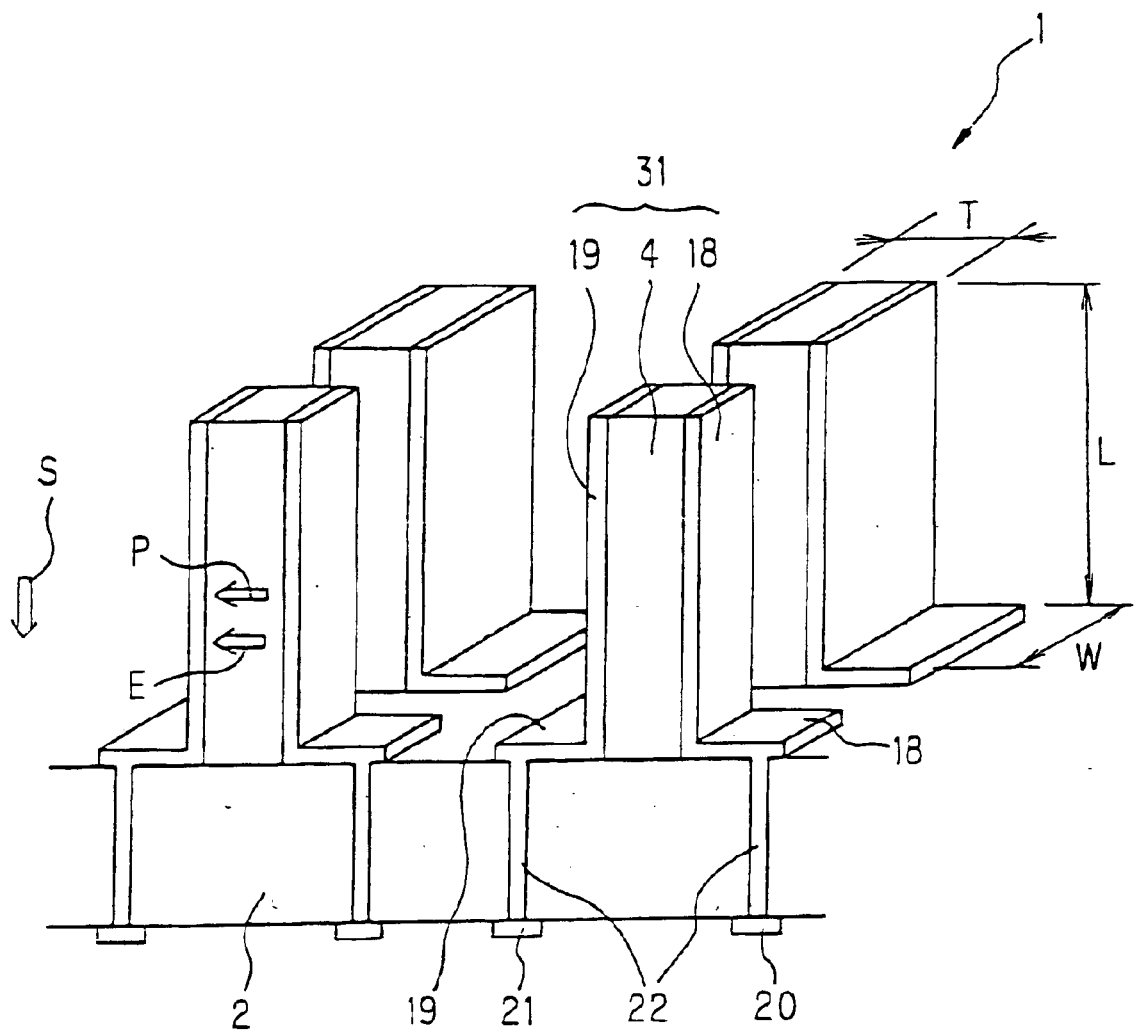
FIG. 1 is a perspective view of an embodiment of a matrix type P/E actuator according to the present invention.

The preferred embodiments of the present invention will be described below by referring now to the accompanied drawings. FIG. 1 is a perspective view of an embodiment of a first matrix type P/E actuator according to the present invention. The matrix type P/E actuator 1 is constituted by a plurality of piezoelectric/electrostrictive elements 31 each consisting of a piezoelectric/electrostrictive body 4 and a pair of electrodes 18 and 19 on a ceramic substrate 2, and the matrix type P/E actuator is activated by the displacement of the piezoelectric/electrostrictive bodies 4 on the ceramic substrate 2. The matrix type P/E actuator 1 according to the present invention has the following characteristic features, which are common to the first matrix actuator:

1) Elements Orderly Arranged in Two Dimensions

Figure 3:
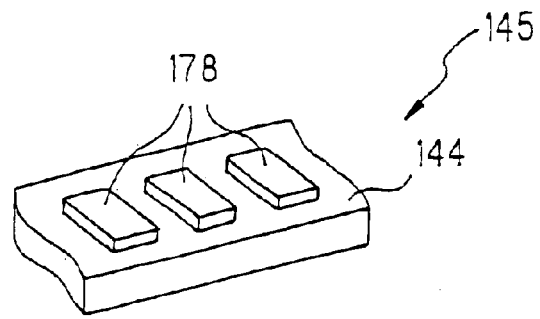
FIG. 3 is a perspective view of an embodiment of a piezoelectric/electrostrictive actuator.
Figure 4:
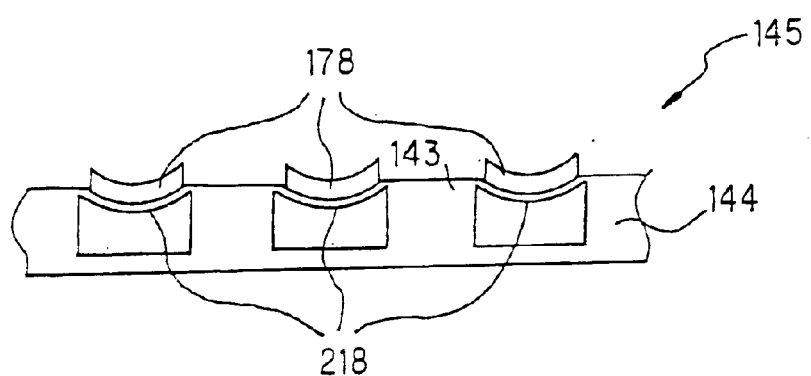
FIG. 4 is a vertical sectional view of an embodiment of a piezoelectric/electrostrictive actuator.
Figure 5:
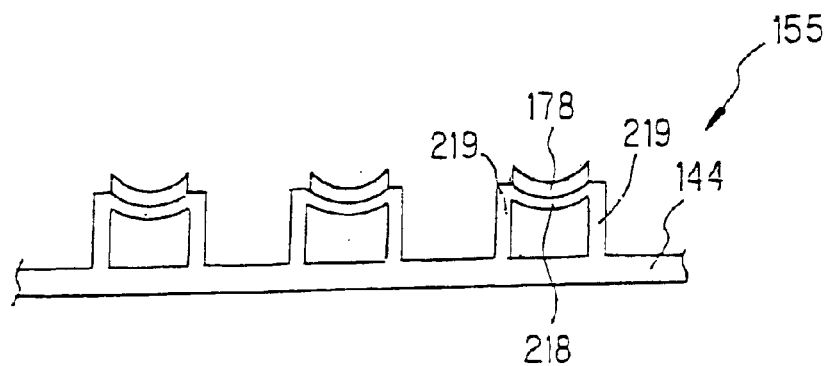
FIG. 5 is a vertical sectional view of another embodiment of a piezoelectric/electrostrictive actuator.

Piezoelectric/electrostrictive elements 31 are orderly arranged on a thick and substantially solid ceramic substrate 2 in the form of two-dimensional matrix in such a manner that they are independent of each other and are unified with the ceramic substrate 2 into one body, but they are not the one wherein unimorph or bimorph type piezoelectric/electrostrictive elements are arranged in a line on the substrate in the above-mentioned conventional piezoelectric/electrostrictive actuator 145, as shown in FIG. 3. Since the thus produced actuator has such a structure that no intervention material inclusive of an adhesive is used between the portions related to the alignment of the elements and the portions that is a basic point for expressing the displacement, not only the dimensional preciseness at the initial stage, the preciseness of the pitches of the elements and the like is high, but also it is free from the deterioration of the intervention materials. Accordingly, this actuator can retain higher dimensional preciseness, piezoelectric/electrostrictive characteristics for a long period of time. Such a structural arrangement ensures a high accuracy in determining the size of the elements, the pitch therebetween and so on, and also permits more accurately mounting the elements when they are used as an actuator for a optical switch, a micro valve, an image display apparatus or the like. In addition, the unified structure provides an excellent strength and a high working efficiency in mounting the elements. The term "thick" herein is used in a sense that the substrate does not serve as a diaphragm.

2) Mutually Perfectly Independent Elements

In the matrix type P/E actuator 1 according to the present invention, the parts generating the displacement correspond to only the parts of the piezoelectric/electrostrictive elements 31 exposed to the outside on the ceramic substrate 2, and there are no parts which are deformed due to the strain induced by the applied electric field in the piezoelectric/electrostrictive body 4 as the structure of the ceramic substrate 2. Each piezoelectric/electrostrictive element 31 is independent of the adjacent piezoelectric/electrostrictive elements 31 and therefore provides no disturbance in the mutual displacements even in a structure unified with the ceramic substrate. As a result, a greater displacement can be stably obtained with a smaller voltage.

3) The Formation of Electrode Terminals

The matrix type P/E actuator 1 is constituted in such a manner that piezoelectric/electrostrictive elements 31 are disposed vertically on the ceramic substrate 2 and electrodes 18 and 19 are formed on the side surfaces which are facing each other and whose distance is shorter among the side surfaces facing each other of the respective piezoelectric/electrostrictive bodies 4. In other words, electrodes 18, and 19 are formed on the faces including the long side of the cross sectional shape of the piezoelectric/electrostrictive body in the piezoelectric/electrostrictive element in the direction parallel to the ceramic substrate, i.e., the faces which include rectangular shape thereof; said shape being one of embodiments of the parallelogram shape. Electrode terminals 20 and 21 are formed on the surface opposite to the surface of the ceramic substrate 2 on which the piezoelectric/electrostrictive elements 31 are disposed. The electrode 18 and the electrode terminal 20, and the electrode 19 and the electrode terminal 21 are formed inside the ceramic substrate 2, and they are wired with via holes 22 into which an electrically conductive material is stuffed. As a matter of course, through holes, onto the inner surface of which an electrically conductive material is applied, can be used instead of the via holes 22. The formation of the electrode terminals on the side opposite to the side on which the piezoelectric/electrostrictive elements 31 of the driving member are arranged provides ease in the subsequent work for connecting the terminals to the power supply, thereby allowing the reduction of yield to be suppressed in the manufacturing process.

4) The Parallelism of the Polarization and the Electric Field for Activation

In the matrix type P/E actuator 1, the piezoelectric/electrostrictive bodies 4 forming the piezoelectric/electrostrictive elements 31 are polarized in the direction P parallel to the main surface of the ceramic substrate 2 in FIG. 1. The electrode terminals 20 and 21 are connected to the power supply, and a voltage is applied between the electrodes 18 and 19 so as to be a positive electrode for the former and to be a negative electrode for the latter, so that an electric field for activation is generated in the direction E. In other words, the electric field for polarization in the piezoelectric/electrostrictive bodies 4 is aligned in the same direction as the electric field for activation. As a result, the piezoelectric/electrostrictive elements 31 are contracted in the direction S perpendicular to the main surface of the ceramic substrate 2 due to the transverse effect of the electric field induced strain of the piezoelectric/electrostrictive bodies 4, whereas the piezoelectric/electrostrictive elements 31 are expanded by the electric field in the direction opposite to the polarization direction P in 180° (however, the electric field has an field strength inducing no reversal of polarization). Since the electric field for polarization in the piezoelectric/electrostrictive bodies 4 forming the piezoelectric/electrostrictive elements 31 is aligned to be parallel to the electric field for activation, in the manufacturing process, it is not necessary to prepare temporary or dummy electrodes for polarization and to apply an electric field thereto in the case of using a mode, for instance, the shear mode (d15), at which the direction of the polarization is not parallel to the electric field for activation, hence, enabling the throughput to be enhanced. Moreover, irrespective of the treatment of polarization, the manufacturing process in which the heating at a temperature higher than the Curie temperature is carried out can be employed. As a result, either soldering with the reflow soldering method or the treatment of bonding with a thermosetting resin can be employed in fixing and wiring the piezoelectric/electrostrictive actuator to, for instance, a circuit board, and therefore the throughput can be further enhanced, inclusive of the manufacturing process of the products involving the actuators, thereby enabling the production cost to be reduced. The state of polarization is not changed, even if greater field strength is used to activate the actuator, rather a more desirable state of polarization can be obtained, and therefore a greater strain can stably be obtained. Thus, one may produce a more compact actuator that is a preferable property as an actuator.

5) Expanding/Contracting Displacement

The actuator utilizes the strain due to the expansion/contraction of the piezoelectric/electrostrictive bodies 4 resulting from the applied electric field not by converting the strain into the displacement in the bending mode, but by directly using the expansion/contraction for the displacement. As a result the preset value in the design for obtaining a large displacement is not attributed to the reduction in generating force or stress. The respective piezoelectric/electrostrictive elements forming the first matrix type P/E actuator generate a displacement $X_B$, which can generally be expressed as, $$X_B = \frac{L}{T} \times d_{31} \times V, \qquad \text{Eq. (1)}$$

and correspondingly generates a stress $F_B$, which can be expressed as, $$F_B = W \times \frac{d_{31}}{S_{11}^E} \times V. \qquad \text{Eq. (2)}$$

That is, the displacement and generating force or stress can be separately determined in the design work, where T, L and W are the thickness, height and width of the piezoelectric/electrostrictive element, respectively and $$S_{11}^E. \qquad \text{Eq. (3)}$$

is the elastic compliance. As can be taken from these equations, it is favorable, structure-wise, to make the thickness T of piezoelectric/electrostrictive body thinner and make the height L thereof higher in order to balance a displacement and a generating force at the same time. However, it is normally very difficult to treat such a thin plate having such a high aspect ratio (L/T) as the one mentioned above, and therefore it is impossible to arrange them in high accuracy. The matrix type P/E actuator according to the present invention can be unitarily formed utilizing the manufacturing method described later, without either treating the individual piezoelectric/electrostrictive bodies or arranging them individually; and therefore the present matrix type P/E actuator has such a feature that one may draw out the benefit being provided with such a structure of the piezoelectric/electrostrictive element as mentioned above to its maximum extent. The above-mentioned aspect ratio may be preferably 20 to 200, for the attainment of a large displacement and a large generating force with a lower driving force.

Figure 9:
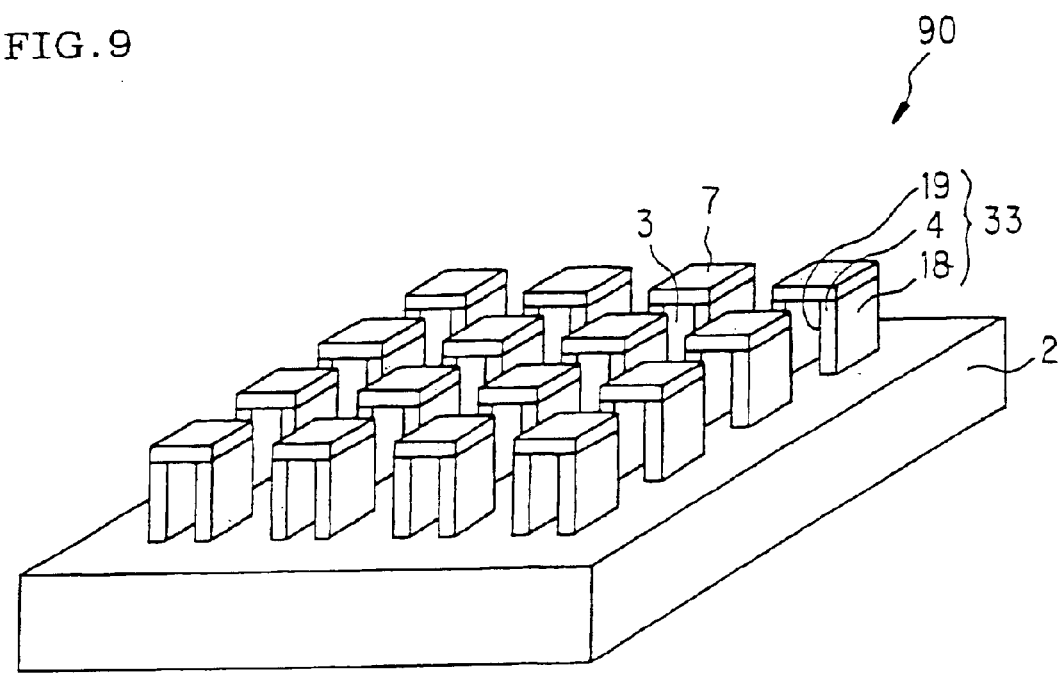
FIG. 9 is a perspective view of still another embodiment of a matrix type P/E actuator according to the present invention.

In the following, referring to the drawings, embodiments of the first matrix type P/E actuator according to the present invention will be further described. The matrix type P/E actuator, which will be described below, also has at least the above-mentioned characteristic features 1) and 2), and more preferably further has the characteristic features 3) to 5). FIG. 9 is a perspective view of another embodiment of the first matrix type P/E actuator according to the present invention. The matrix type P/E actuator 90 is constituted in such a manner that a plurality of piezoelectric/electrostrictive elements 33, each consisting of a piezoelectric/electrostrictive body 4 and a pair of electrodes 18 and 19, are orderly arranged on a ceramic substrate 2, and a cell 3 is formed by closing with a plane plate 7 the surface on the side opposite to that of the ceramic substrate 2 on which each pair of adjacent piezoelectric/electrostrictive elements 33 stands. The piezoelectric/electrostrictive body 4 expresses a strain due to the applied electric field on the ceramic substrate 2, so that the actuator is activated as a result of the expansion/contraction of the piezoelectric/electrostrictive elements 33.

One may expand/contract a pair of piezoelectric/electrostrictive elements 33 simultaneously, one may expand/contract only either one of them, or it may be preferable that one may make such an opposite movement that either one of them is expanded and the other is contracted. When, for example, a plurality of the plane plates 7 that are the activation surface is pushed against an object to be pressed, the object to be pressed may be pressed with a greater driving force if a simultaneous expansion of a plurality of piezoelectric/electrostrictive elements 33 is used to push the plurality of the plane plates 7 against the object, compared with the expansion of a single piezoelectric/electrostrictive element 33. This means that the present case is identical with the case in which the width W of the piezoelectric/electrostrictive element becomes 2W. Furthermore, the cell structure in this case preferably provides a greater mechanical strength, and a greater displacement and a greater generating force as well due to the existence of the plane plate 7, compared with the structure of a single element, even if the thickness T of the piezoelectric/electrostrictive element is reduced. Moreover, one may incline the plane plate 7 with an angle from the horizontal surface by moving them in such an opposite manner that either one of them is expanded, and that the other is contracted or by operating only either one of them. Therefore, if a micro mirror is used as a plane plate 7, for instance, the application field of the present actuator may be expanded to an optical system such as a projector or the like in which the reflecting angle with respect to an incident beam is altered.

Figure 26:
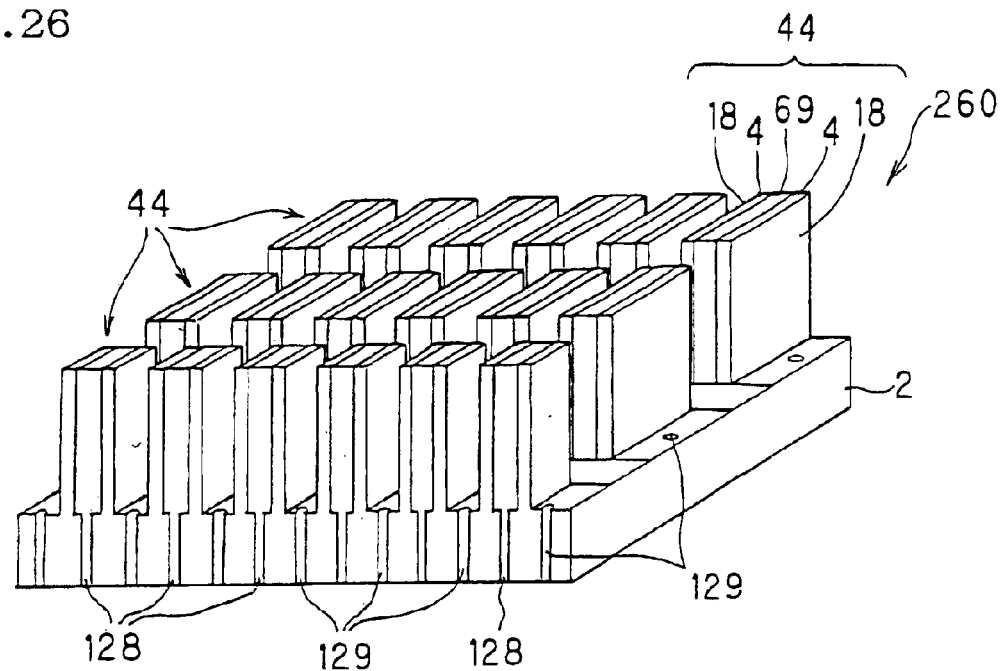
FIG. 26 is a perspective view of still another embodiment of a matrix type P/E actuator according to the present invention.

FIG. 26 is a perspective view of still another embodiment of the first matrix type P/E actuator according to the present invention. The matrix type P/E actuator 200 is constituted in such a manner that a plurality of piezoelectric/electrostrictive elements 44; each of which comprises a pair of piezoelectric/electrostrictive bodies 4 and electrodes 18 and 69 being arranged adjacently on a ceramic substrate 2. And, through holes 128, 129 are formed across the ceramic substrate 2 on a face in an opposite direction to the face on which piezoelectric/electrostrictive elements 44 are disposed; said through holes being bored through the ceramic substrate 2, being coated with an electrically conductive material, and through which leads are led to the electrodes not depicted. An electrically conductive material having a flexibility, such as for example, an electrically conductive resin having an adhesiveness is housed between the pair of the piezoelectric/electrostrictive bodies 4; said conductive material being functioned as one of the electrodes. The electrode may be provided with such a flexibility that the strain induced by piezoelectric/electrostrictive bodies 4 is not inhibited. Moreover, the electrodes 18 are formed on the surface of a pair of the piezoelectric/electrostrictive elements 4 opposite to the surface on which the electrode 69 is formed. That is, the piezoelectric/electrostrictive element 44 is a combined one formed from a single piezoelectric/electrostrictive element comprising a pair of the piezoelectric/electrostrictive bodies 4, the electrodes 18, and the electrode 69, with sharing the electrode 69 therebetween.

In the case of the matrix type P/E actuator 260, a single body for a pair of piezoelectric/electrostrictive bodies 4 which constitutes a piezoelectric/electrostrictive element 44 may be made thinner and higher, thus, resultantly the strain may be expressed easier. On the other hand, the piezoelectric/electrostrictive element 44 is constituted of a pair of the piezoelectric/electrostrictive bodies 4 disposed by facing each other via the flexible electroconductive material, i.e., the electrode 69, the mechanical strength may be secured. Thus, it may exert the function as an piezoelectric/electrostrictive element having a high performance since a greater displacement and a greater generating force may be attained by a lower driving voltage. The effects of the structure may be more advantageously utilized in the case of the present embodiment, even compared with the above-mentioned matrix type P/E actuator 90.

Although it is not depicted, one may form an actuator with a set of three or more piezoelectric/electrostrictive elements as piezoelectric/electrostrictive element 33, and combining them by covering with a plane plate 7 the surface opposite to the ceramic substrate 2. Furthermore, one may form a closed cell 3 by constituting the four side faces thereof with four sets of the piezoelectric/electrostrictive elements 33.

Figure 10:
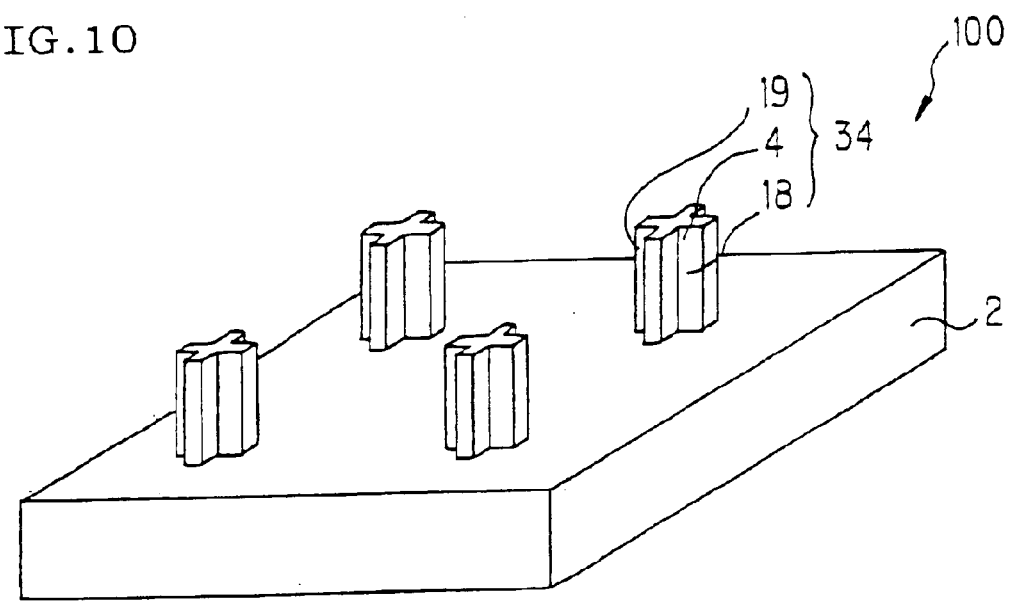
FIG. 10 is a perspective view of still another embodiment of a matrix type P/E actuator according to the present invention.

FIG. 10 is a perspective view of another embodiment of a first matrix type P/E actuator according to the present invention. The matrix type P/E actuator 100 is constituted by arranging adjacently a plurality of piezoelectric/electrostrictive elements 34 consisting of piezoelectric/electrostrictive bodies 4 having a cross-shaped horizontal section and a pair of electrodes 18 and 19 on a ceramic substrate 2. The piezoelectric/electrostrictive bodies 4 generate a strain on the ceramic substrate 2 due to an applied electric field, so that the piezoelectric/electrostrictive elements 34 is activated as a result of the expansion/contraction thereof.

A greater rigidity as a structure will increase and an axis of displacement is stable if one may make the shape of the piezoelectric/electrostrictive body 4 a cross-like shape, so that the direction of displacement may be more stabilized, compared with the matrix type P/E actuator 1 shown in FIG. 1, and a generating force based on the strain will become larger.

Figure 11:
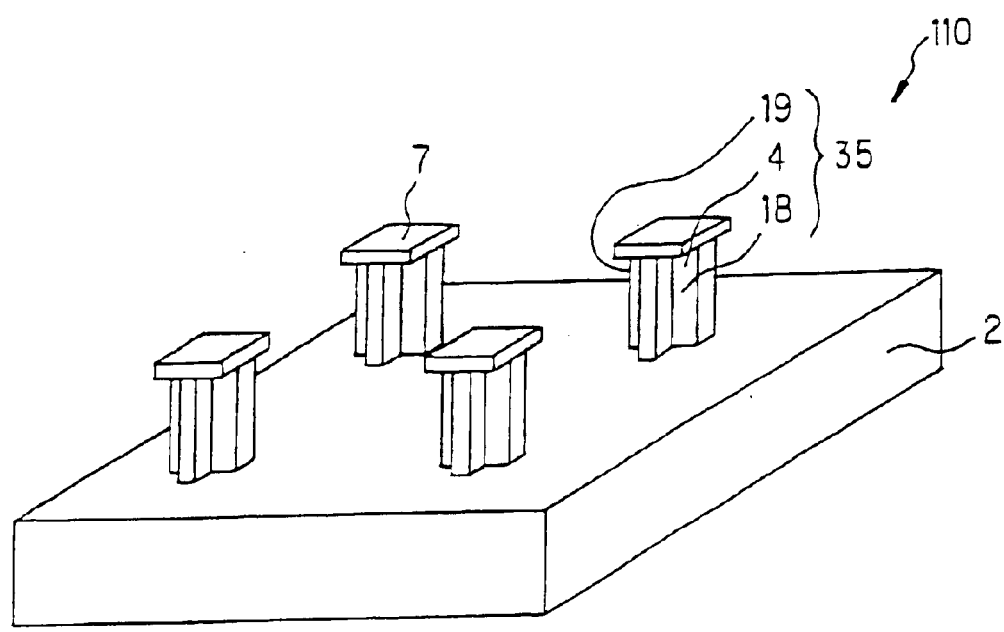
FIG. 11 is a perspective view of still another embodiment of a matrix type P/E actuator according to the present invention.

FIG. 11 shows a matrix type P/E actuator 110 in which a plane plate 7 is adapted to the surface of each piezoelectric/electrostrictive elements 34 on the side opposite to the side of a ceramic substrate 2 in the matrix type P/E actuator 100 shown in FIG. 10. Similarly to the matrix type P/E actuator 100, a plurality of piezoelectric/electrostrictive elements 35 are adjacently arranged on the ceramic substrate 2, the piezoelectric/electro-strictive bodies 4 generate strain due to the applied electric field on the ceramic substrate 2, so that the piezoelectric/electro-strictive elements 35 are activated by the expansion/contraction.

Compared with the matrix type P/E actuator 100, a rigidity of the structure is greatly increased because, in addition to the cross-shaped piezoelectric/electrostrictive bodies 4, are co-used the plane plate 7. As a result, the axis of displacement is very accurately determined and, therefore, the direction of displacement is further stabilized. Moreover, with utilizing a greater generating force being generated, the plane plates 7 further provide a greater area for pressure, when, for instance, the actuator is pressed against an article to be pressed.

Figure 24:
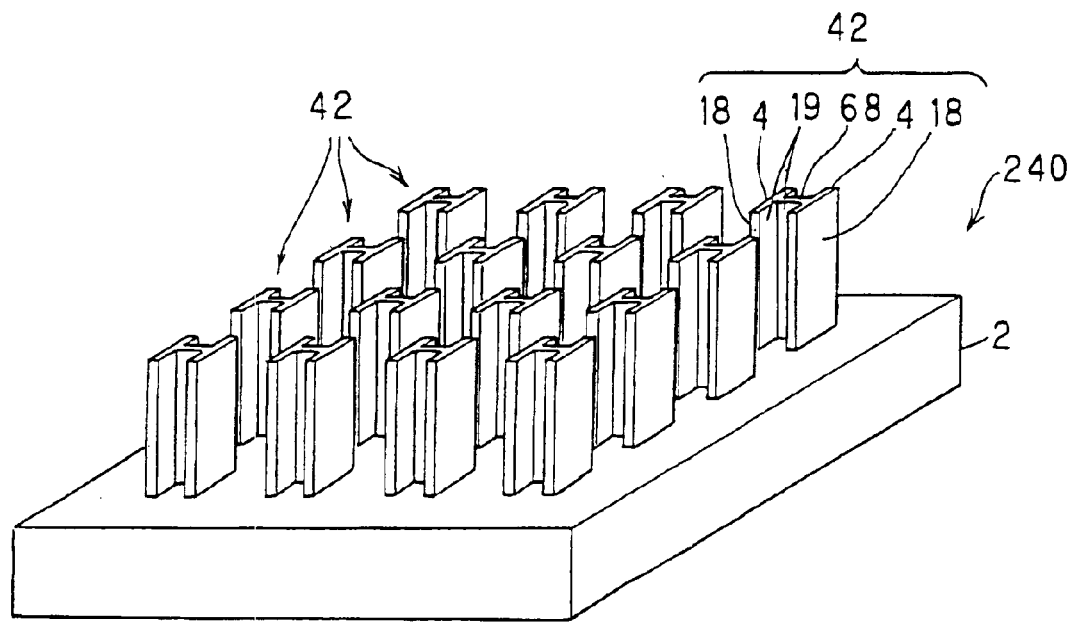
FIG. 24 is a perspective view of still another embodiment of a matrix type P/E actuator according to the present invention.

FIG. 24 is a perspective view of another embodiment of the first matrix type P/E actuator according to the present invention. The matrix type P/E actuator 240 possesses piezoelectric/electrostrictive elements 42 in which a pair of piezoelectric/electrostrictive bodies 4 are connected with a junction member 68 instead of a highly flexible conductive material, i.e., the electrode 69. Namely, the matrix type P/E actuator 240 is composed of a plurality of piezoelectric/electrostrictive elements 42 formed adjacently each other; and said elements comprise a pair of piezoelectric/electrostrictive bodies connected with a junction member 68, and the electrodes 18, 19.

The junction member 68 itself is composed of a piezoelectric/electrostrictive body 4 and an electrode 19 is formed on the both main faces of the junction member 68 in the piezoelectric/electrostrictive element 42. Thus, the junction member 68 may also contribute in the expression of the strain and the force. The piezoelectric/electrostrictive element 42 also becomes strong in the mechanical strength, in the case of the matrix type P/E actuator 240. Thus, the effects of the structure may be more advantageously utilized like in the case of the matrix type P/E actuator 260. This junction member may join piezoelectric/electrostrictive bodies facing each other in any portion thereof, and it may have any form as a horizontal cross section inclusive of U-like shape, Z-like shape in addition to H-like shape shown in FIG. 24.

Figure 12:
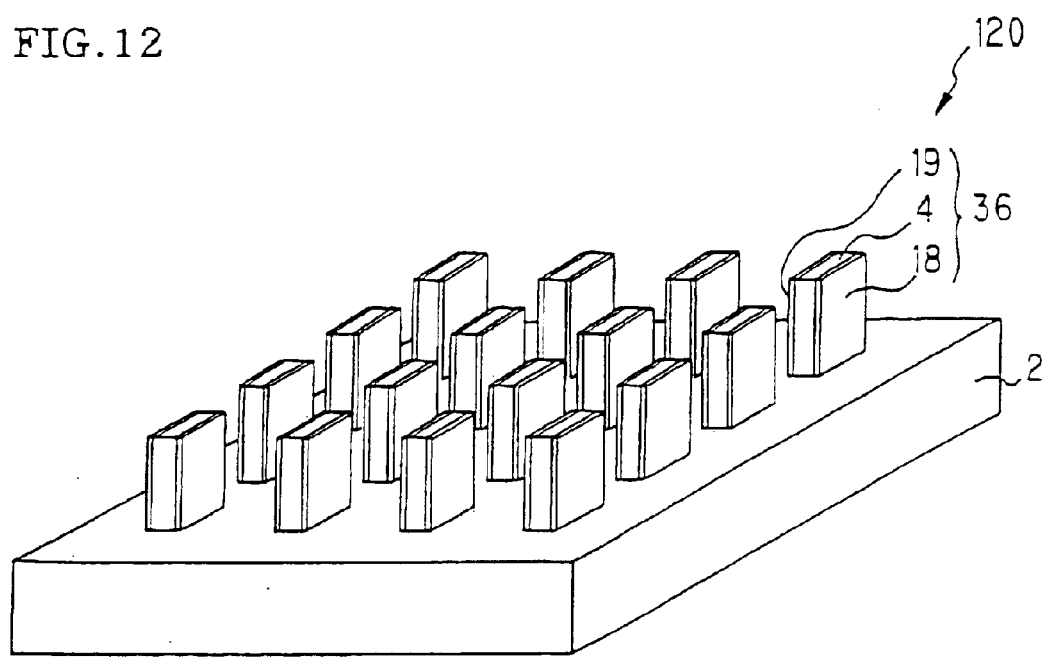
FIG. 12 is a perspective view of still another embodiment of a matrix type P/E actuator according to the present invention.

FIG. 12 shows a matrix type P/E actuator 120, which is almost the same as the matrix type P/E actuator 1 in FIG. 1. In this case, electrodes 18 and 19 are not horizontally expanded on the substrate, and are connected to electrode terminals (not depicted) on the backside just below the electrodes 18 and 19 on the side surfaces through via holes or through holes (not depicted). Similarly, a plurality of piezoelectric/electrostrictive elements 36 are adjacently disposed on the ceramic substrate 2. Each piezoelectric/electrostrictive body 4 generates a strain on the ceramic substrate 2 due to an applied electric field, and each piezoelectric/electrostrictive element 36 is activated by the expansion/contraction thereof.

Figure 21:
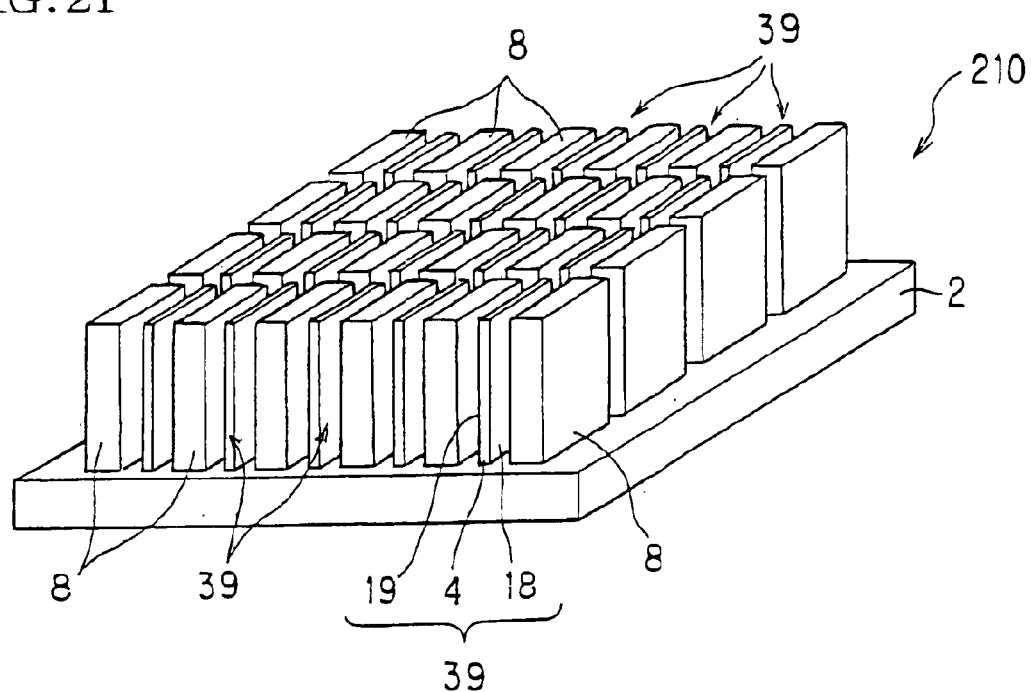
FIG. 21 is a perspective view of still another embodiment of a matrix type P/E actuator according to the present invention.

FIG. 21 is a perspective view of still another embodiment of the first matrix type P/E actuator according to the present invention. The matrix type P/E actuator 240 is provided with a wall portion 8 between the piezoelectric/electrostrictive elements 39 being positioned adjacently to each other in a direction of one axis. If one employs this structure, not only the electric interference between the adjacent piezoelectric/electrostrictive elements, but also the wall portion 8 can be used as a joining portion for the object to be applied to the matrix type P/E actuator. Thus, a portion of the object to be applied can be protected effectively from the effects transported from the neighboring portion to be applied in the object during the operation of the actuator. According to the present embodiment, a matrix type P/E actuator having a high efficiency and a high performance may be realized. This is because one may apply concentratedly strain or force generated on the predetermined portion and its vicinity of the object to be applied in addition to the feature of the matrix type P/E actuator that the interference in the action between the respective piezoelectric/electrostrictive elements is extremely small.

The height of the wall portion and that of piezoelectric/electrostrictive element is not necessarily the same as each other like the case of the matrix type P/E actuator 210 shown in FIG. 21 under the state that the electric power is not applied. For example, the wall portion may be lower than the piezoelectric/electrostrictive elements, like the case of the matrix type P/E actuator 220 shown in FIG. 22, or the wall portion may be higher than the piezoelectric/electrostrictive elements, like the case of the matrix type P/E actuator 230 shown in FIG. 23. That is, one may choose the height of them, depending upon the object to be applied.

Figure 27:
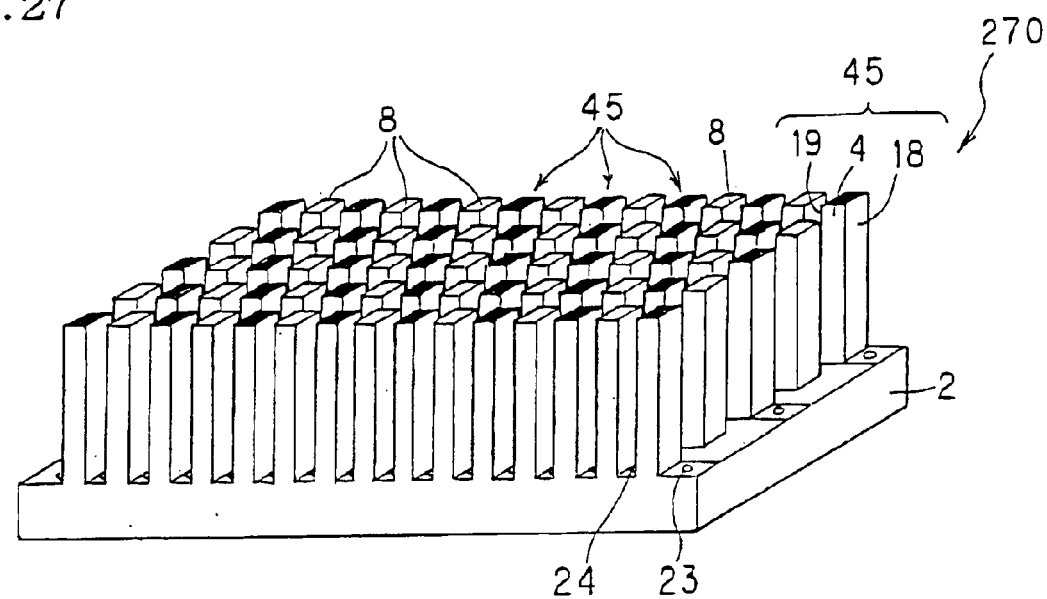
FIG. 27 is a perspective view of still another embodiment of a matrix type P/E actuator according to the present invention.

It is also preferable to form the wall portions between piezoelectric/electrostrictive elements being positioned adjacently in the directions of two axes in addition to the formation of the wall portions between piezoelectric/electrostrictive elements being positioned adjacently in the direction of one axis. The matrix type P/E actuator 270 shown in FIG. 27 is an example of this embodiment. In the case of the matrix type P/E actuator 270, the effect applied from the piezoelectric/electrostrictive elements 45 is hardly lost, compared with the above-mentioned matrix type P/E actuators 210, 220, and 230. This is because the wall portions are disposed adjacently to piezoelectric/electrostrictive element 45 in the directions of two axes.

The wall portions are made of the same material as that for the piezoelectric/electrostrictive element. Thus, the following constitution may be employed. Firstly, some portion is in advance formed as a wall portion in the actuator without forming the portions for wiring such as via holes, through holes, or the like when the actuator is formed. Secondly, it may have wiring portions as a piezoelectric/electrostrictive element, however, they are used only for a wall portion, without being used for wiring.

Figure 25:
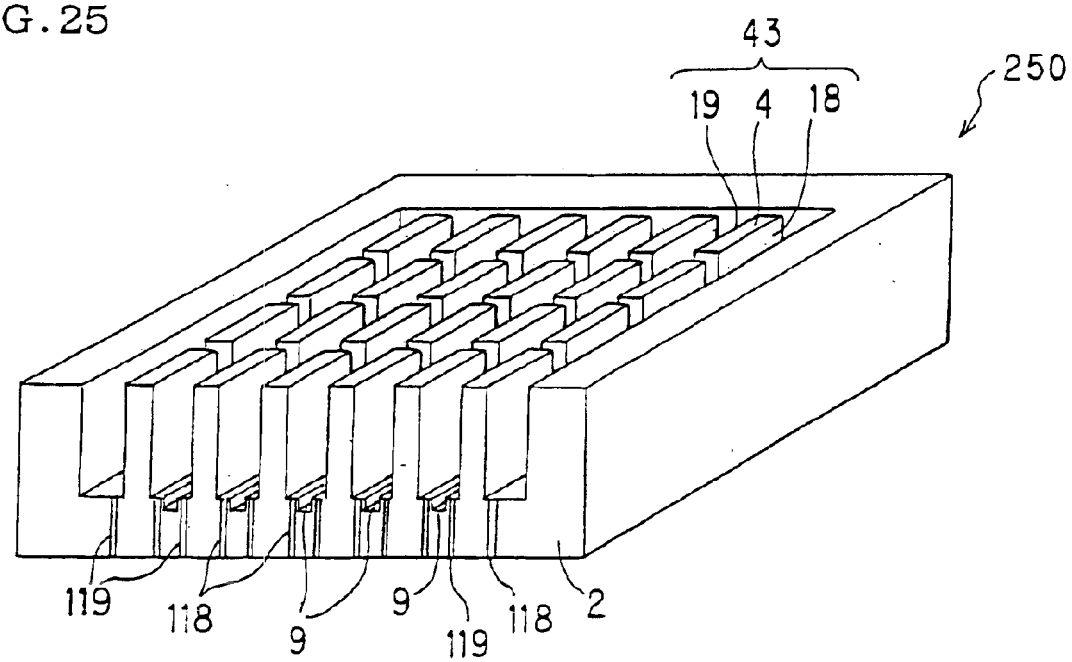
FIG. 25 is a perspective view of still another embodiment of a matrix type P/E actuator according to the present invention.

FIG. 25 is a perspective view of still another embodiment of the first matrix type P/E actuator according to the present invention. The matrix type P/E actuator 250 is provided with a plurality of grooves 9 formed between the piezoelectric/electrostrictive elements 43 positioned adjacently to each other. According to this structure of the present embodiment, one may easily make a polarity of each surface of the electrodes facing each other and being formed on the adjacent piezoelectric/electrostrictive elements 43 via the groove portion different. Thus, the possibility of causing a short circuit would be reduced even if one makes the pitches between the piezoelectric/electrostrictive elements 43 short. This is because the insulation between the electrodes could be secured due to the formation of the groove portions 9. The above-mentioned embodiments shown in FIGS. 21, 22, 23, 24, and 25 are applicable not only to the first matrix type P/E actuator of present invention, but also to the second matrix type P/E actuator of present invention which will be discussed later.

Figure 28:
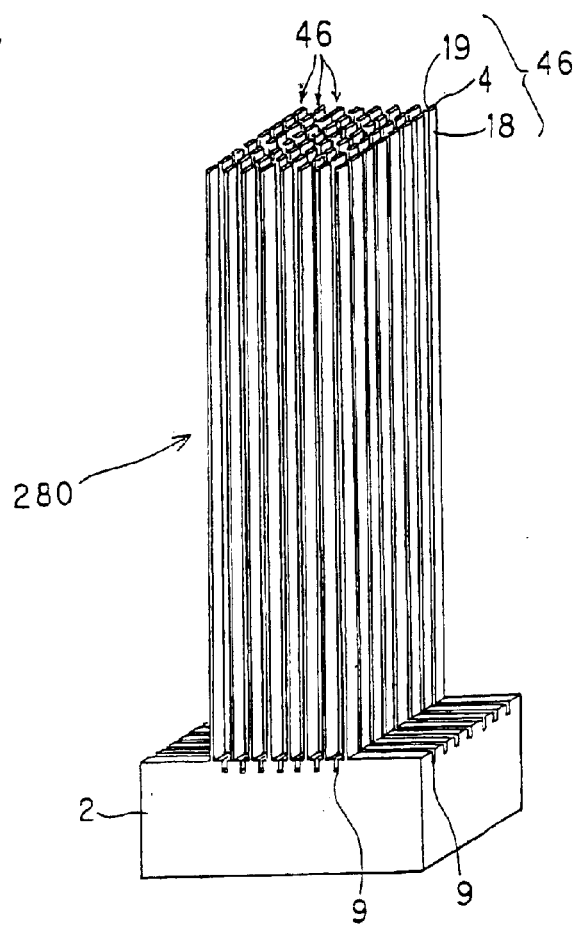
FIG. 28 is a perspective view of still another embodiment of a matrix type P/E actuator according to the present invention.

The matrix type P/E actuator of FIG. 28 comprises the piezoelectric/electrostrictive elements 46 having a high aspect ratio being aligned with high pitch, i.e., high density. According to the present embodiment, one may arrange two dimensionally a plurality of the piezoelectric/electrostrictive elements 46 having a larger dimension in one direction at the predetermined pitches with a high yield without handling the respective piezoelectric/electrostrictive elements; i.e., bonding a substrate 2 with a piezoelectric/electrostrictive element 46, or the substrates 3 each other.

It is preferable, for the practical use, to fill, the gaps between the respective piezoelectric/electrostrictive elements, an insulating material having such a flexibility that the strain and the force generated are not inhibited by said material so as to protect the dropping of an insulating property due to the foreign materials invaded into the gaps between the respective piezoelectric/electrostrictive elements, the improvement in handling performance, and the like. The pitch employed advantageously in the present invention is 3 mm or less, preferably 2 mm or less, more preferably 0.1 mm to 1 mm. It is required to suppress the change in the composition of the ingredients in the surface of the piezoelectric/electrostrictive elements by sintering a green body of the actuator under the state that the sintering atmosphere is kept homogeneously among the respective piezoelectric/electrostrictive elements, especially when an actuator having a high performance is intended to obtain. This is because a major surface portion of piezoelectric/electrostrictive element is formed from the sintered surface with a little surface formed by subjecting a remaining portion thereof to mechanical processing, as is discussed later.

If the pitch between the piezoelectric/electrostrictive elements exceeds 3 mm, the sintering atmosphere is liable not to be homogeneous; and this results in the formation of a big fluctuation in the piezoelectric characteristic of the produced piezoelectric/electrostrictive element. On the other hand, if the pitch is below 0.1 mm, consequently the size of each of piezoelectric/electrostrictive elements becomes smaller, and the ratio of the surface of piezoelectric/electrostrictive elements in the total volume of the piezoelectric/electrostrictive element becomes larger. This would also act as a factor causing the big fluctuation in the piezoelectric characteristic of the produced piezoelectric/electrostrictive element.

Figure 37:
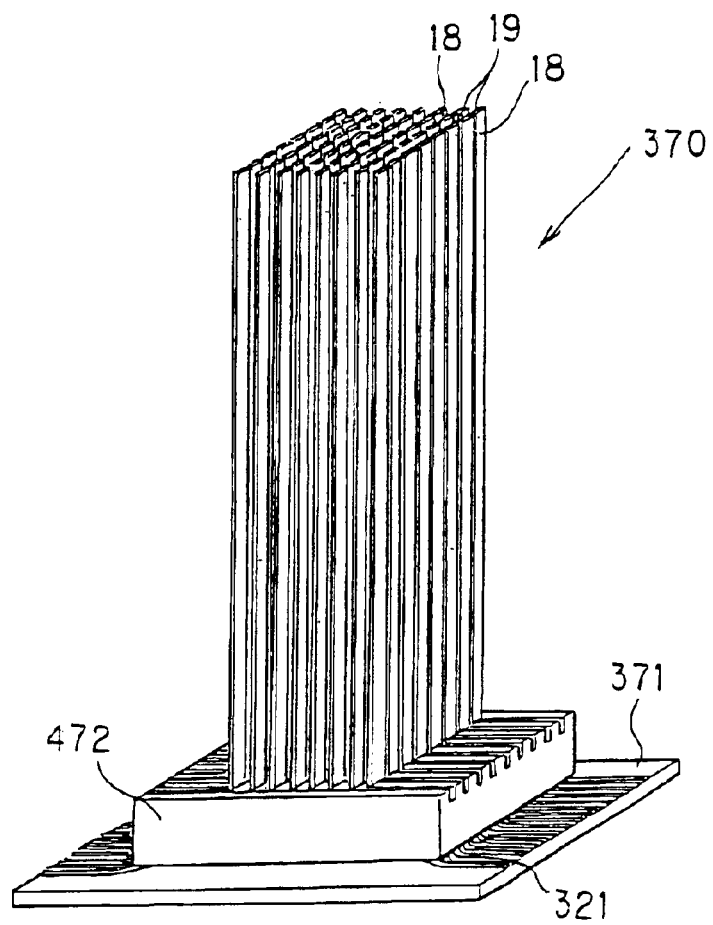
FIG. 37 is a perspective view of still another embodiment of a matrix type P/E actuator according to the present invention.

The matrix type P/E actuator 370 shown in FIG. 37 comprises also, like the matrix type P/E actuator 280, the piezoelectric/electrostrictive elements 46 having a high aspect ratio being aligned with high density. The electrodes 321 are disposed on the front surface of the actuator by virtue of utilizing via-holes not depicted and being formed through the ceramic substrate 472, and a circuit board 371 mounted on a side opposite to the side of the substrate on which the piezoelectric/electrostrictive elements are disposed. The electrode terminals 321 may be easily joined with an electric power supply by employing the structure like the one mentioned above. Moreover, the circuit board 371 may be utilized for handling.

Figure 8:
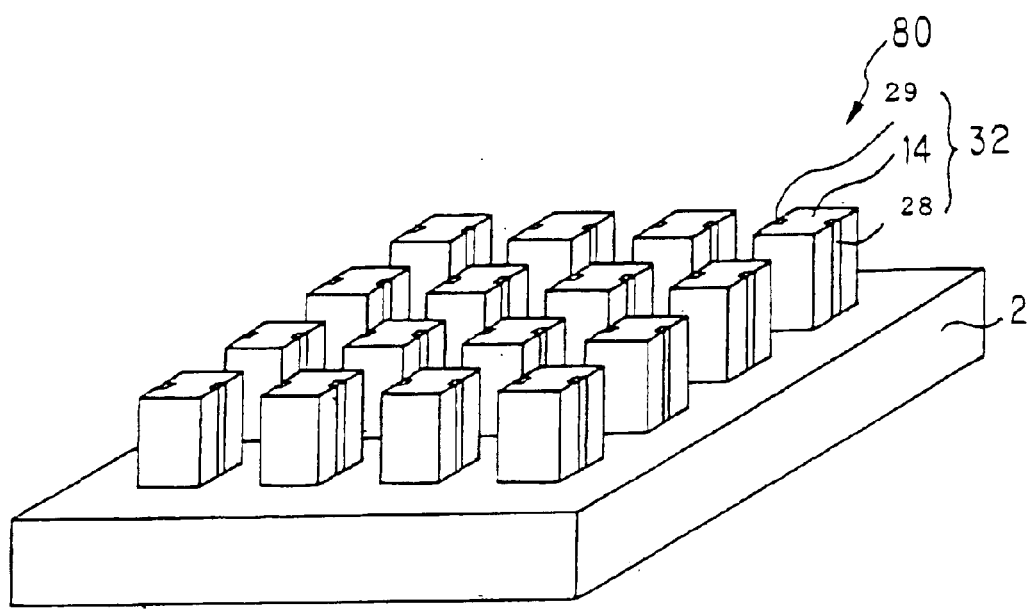
FIG. 8 is a perspective view of another embodiment of a matrix type P/E actuator according to the present invention.

In the following, a second matrix type P/E actuator according to the present invention will be described. FIG. 8 shows a perspective view of an embodiment of a second matrix type P/E actuator according to the present invention. The matrix type P/E actuator 80 comprises a plurality of piezoelectric/electrostrictive elements 32 each including a piezoelectric/electrostrictive body 14, a pair of electrode, more specifically, a pair of common electrodes 28 and 29 and internal electrodes 48 and 49 on a ceramic substrate 2, and the actuator is a piezoelectric/electrostrictive actuator in which each piezoelectric/electrostrictive body 14 generates a strain due to an applied electric field on the ceramic substrate 2, thereby enabling the activation to be achieved. The second matrix type P/E actuator 80 has at least the characteristic features 1) elements orderly arranged in two dimensions and 2) perfect mutual independent elements, similarly to the first matrix type P/E actuator, and preferably has the characteristic features 3) the formation of electrode terminals, 4) the parallelism of the polarization field and the electric field for activation, and 5) expanding/contracting displacement.

However, the second matrix type P/E actuator is different from the first matrix type P/E actuator in the following two points: Firstly, the piezoelectric/electrostrictive elements are not those wherein piezoelectric/electrostrictive elements having an approximately rectangular parallelepiped shape are vertically disposed on the ceramic substrate, and a pair of electrodes is merely formed on the side surfaces of the piezoelectric/electrostrictive bodies, as described in the item, 3) the formation of electrode terminals, but those wherein stratiform piezoelectric/electrostrictive bodies and stratiform internal electrodes are laminated alternately on the ceramic substrate. Moreover, in the case of the matrix type P/E actuator 80 shown in FIG. 8, the electrodes are formed also on the side surfaces of the piezoelectric/electrostrictive elements. However, each of those electrodes is connected with each of the internal electrodes positioned at every two layers, as is discussed later. Thus, it acts the function as a common electrode so as to apply the same signal to the respective internal electrode positioned at every two layers. Therefore, the position to be formed is not restricted to the side surfaces of the piezoelectric/electrostrictive element, as far as it can show the same function as a common electrode.

Secondarily, the piezoelectric/electrostrictive elements are not only expanded/contracted in the vertical direction with respect to the main surface of the ceramic substrate by the displacement due to the transverse effect of the electric field induced strain by to the piezoelectric/electrostrictive elements, as described in the item, 4) the parallelism of the polarization field and the electric field for activation, but also expanded/contracted in the vertical direction with respect to the main surface of the ceramic substrate by the displacement due to the longitudinal effect of the electric field induced strain.

Figure 13A:
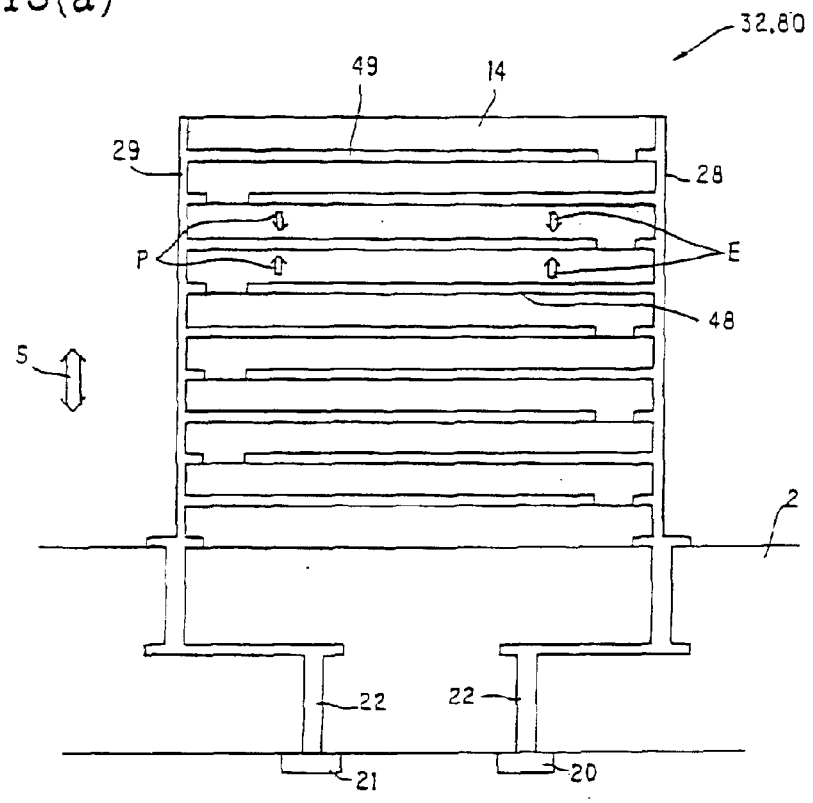
FIGS. 13(a) and (b) show vertical sectional views of two different embodiments of a matrix type P/E actuator according to the present invention, respectively.

FIG. 13(a) is a vertical sectional view of the piezoelectric/electrostrictive elements 32 in the matrix type P/E actuator 80 shown in FIG. 8; said view being viewed from the vertical section wherein the common electrodes 28 and 29 and the internal electrodes 48 and 49 pass through. In the matrix type P/E actuator 80, the piezoelectric/electrostrictive element 32 has 10 layers of the piezoelectric/electrostrictive bodies 14, wherein the stratiform piezoelectric/electrostrictive bodies 14, and the stratiform internal electrodes 48 and 49 are laminated alternately. The number of laminated piezoelectric/electrostrictive layers, however, will be chosen, depending upon the application and the aim of usage. It is preferably 10 to 200 layers, in view of the stability in the actuator characteristics and the easiness in production.

In the matrix type P/E actuator 80, piezoelectric/electrostrictive bodies 14 forming the piezoelectric/electrostrictive elements 32 are polarized, e.g., in direction P in the drawing, and the power supply is connected to the electrode terminals 20 and 21. An electric field in direction E is generated by applying a voltage between the common electrodes 28 and 29 such that the common electrode 28 becomes plus and the common electrode 29 becomes minus. That is, the stratiform piezoelectric/electrostrictive bodies 14 polarized in the direction opposite to each other are laminated in such a manner that they are alternately interleaved between the adjacent internal electrodes 48 and 49, and the polarization field is aligned in the same direction as the electric field for activation in each piezoelectric/electrostrictive body 14. As a result, each piezoelectric/electrostrictive body generates an electric field induced strain, and therefore the piezoelectric/electrostrictive elements 32 are expanded/contracted in direction S, i.e., in the direction of lamination, by the displacement due to the longitudinal effect of the strain. Since this expansion/contraction displacement is not the bending displacement such as the conventional unimorph or bimorph and results from the direct usage of the electric field induced strain, a greater generating force and a higher responsive speed can be obtained. Moreover, the piezoelectric/electrostrictive elements of this type are excellent from the viewpoint of the generating force and the responsive speed, compared with piezoelectric/electrostrictive elements shown in FIG. 1 and others, where said elements utilize the transverse effect of the electric field induced strain. The amount of displacement generated from each layer is small. Since, however, the amount of displacement is proportional to the number of piezoelectric/electrostrictive layers, more accurately the number of sets each comprising a unit of piezoelectric/electrostrictive layer and a pair of electrodes, a greater amount of displacement can be obtained by increasing the number of layers. However, there are disadvantages in that the increase of the number of layers brings a reduction of the reliability regarding the electrical connection between the common electrodes, and an increase in the consumption of electricity due to the increase in the capacitance in addition to an increase in the number of process steps.

Moreover, in the matrix type P/E actuator 80 shown in FIG. 8, the thickness per layer of one piezoelectric/electrostrictive body 14 should be preferably 100 μm or smaller, more preferably 10 to 80 μm in order to activate it at a low voltage.

Figure 13B:
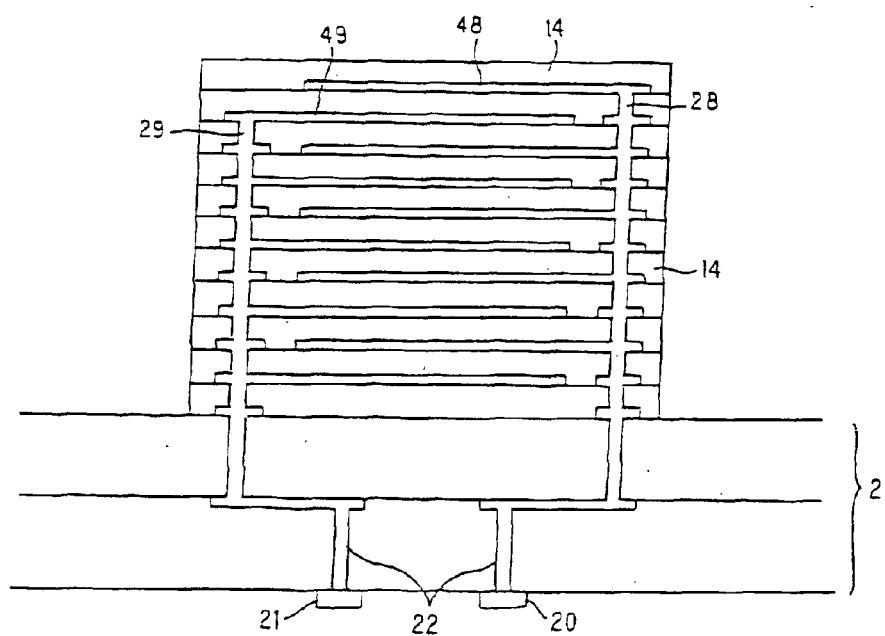

In FIG. 13(a), the common electrodes 28 and 29 are exposed to the outside of the piezoelectric/electrostrictive elements. However, it is possible to dispose the common electrodes inside the piezoelectric/electrostrictive elements, as shown in FIG. 13(b). In this case, since the respective electrodes in the piezoelectric/electrostrictive elements are isolated from the outside, the pitch between the adjacent elements may be made smaller. Therefore, this constitution is preferable for an actuator having a higher density.

Referring now to the drawings, the first and second matrix type P/E actuators according to the present invention will be described for several examples of application. In the following description, the first or second matrix type P/E actuator is referred to simply as an actuator. Moreover, any of the first and second matrix type P/E actuators can be employed as an actuator component in the following examples of application.

Figure 6A:
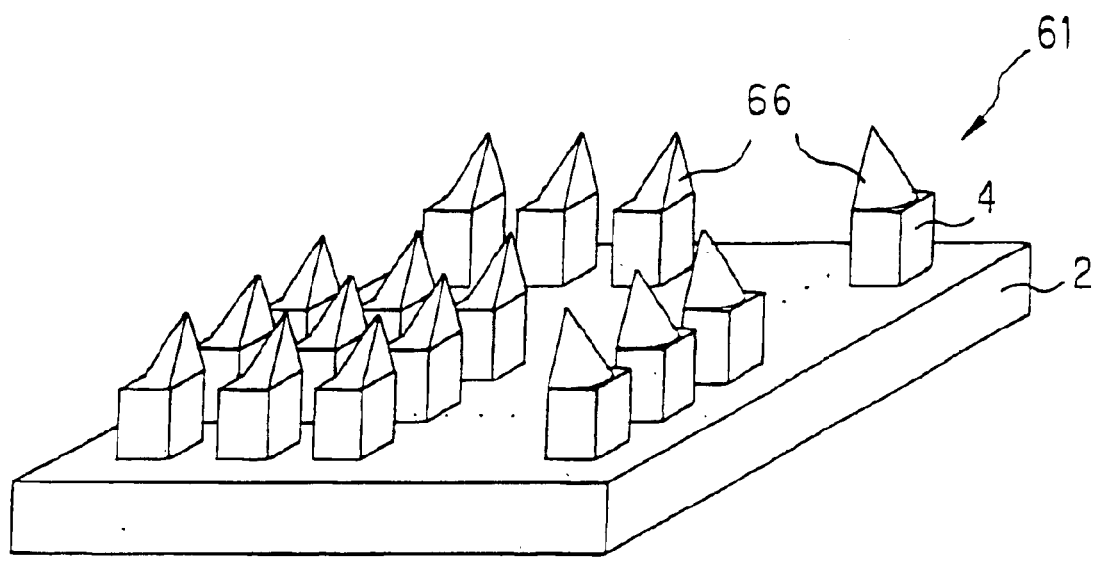
FIGS. 6(a) and (b) show an example of application of a matrix type P/E actuator according to the present invention, where
Figure 6B:
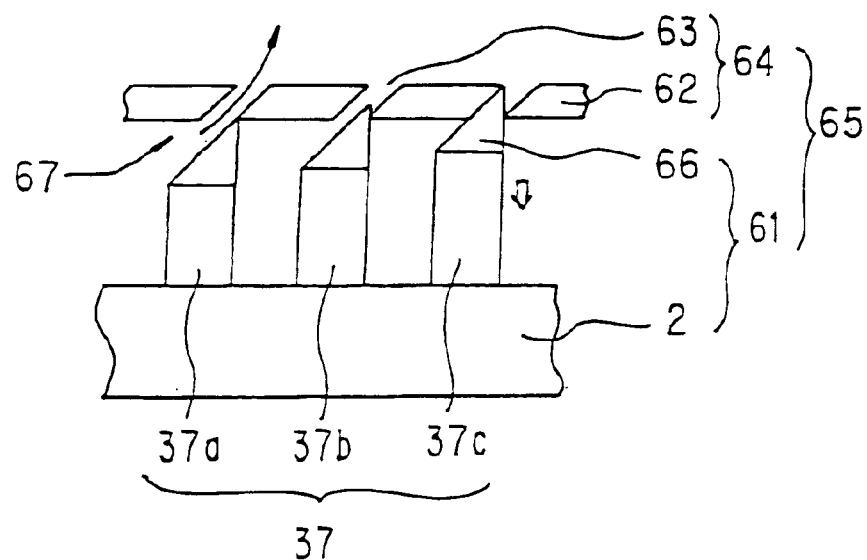
FIG. 6(b) is a schematic vertical sectional view of the operation state of the micro valve.

FIGS. 6(a) and (b) show a matrix type P/E actuator according to the present invention, which is employed as a micro valve unit, where FIG. 6(a) is a perspective view of the actuator component of the micro valve unit, and FIG. 6(b) is a vertical sectional view of the micro valve unit. A micro valve 65 comprises a valve seat member 64 and an actuator member 61, and it is a micro valve unit in which a matrix type P/E actuator is used as an actuator member 61.

The valve seat member 64 includes an opening 63 paired with each of the piezoelectric/electrostrictive elements 37 in the actuator member 61. The actuator member 61 comprises a piezoelectric/electrostrictive element 37 capable of displacing in accordance with an external signal, and a valve body member 66 disposed on the surface of the piezoelectric/electrostrictive element 37 opposite to the ceramic substrate 2. The displacement of the piezoelectric/electrostrictive element 37 in the actuator member 61 may change a space of the cross section for the flow through the opening 63 by approaching/separating the valve body member 66 towards/from the opening 63 in the valve seat member 64. By this action, for instance, the flow amount of fluid 67 passing through the opening 63 can be adjusted.

In the micro valve 65, a space of the cross section of flow in the opening 63 can be freely adjusted by changing the displacement of the piezoelectric/electrostrictive elements 37. FIG. 6(b) schematically shows the state of the piezoelectric/electrostrictive elements 37, where, if the piezoelectric/electrostrictive elements are those in FIG. 1, the piezoelectric/electrostrictive element 37a on the left side in FIG. 6(b) is in a contracted state under the applied voltage, and the opening 63 in the valve body member 66 is completely opened, thereby the flow amount of fluid 67 passing through the opening 63 to be maximized. In FIG. 6(b), moreover, the piezoelectric/electrostrictive element 37c on the right side is in the inactivated state, and the opening 63 in the valve body member 66 is completely closed, thereby the fluid 67 is blocked in the opening 63. By changing the amount of the displacement of the piezoelectric/electrostrictive element 37, it is possible to arbitrarily set the states of the piezoelectric/electrostrictive elements 37a to 37c. As a result, the flow cross area of the opening 63 can be freely adjusted, so that the flow amount of the fluid 67 passing through the opening 63 can also be controlled. The middle piezoelectric/electrostrictive element 37b is set in such a state. Consequently, the micro valves 65 serve to function not only as an ON/OFF valve, but also as a regulating valve.

The shape of the opening 63 and the valve body member 66 is not restricted to that shown in this example. One may determine the shape of the opening 63 and the valve body member 66 in a manner similar to the ordinary valve after studying whether the relationship between the displacement of piezoelectric/electrostrictive element 37 and the flow amount of fluid 67 is set to be linear or quadric, and the like.

The micro valve enables the flow amount of a fluid passing through the opening to be freely controlled. It is therefore possible to arbitrarily change the pressure of the fluid, for instance air, blowing out from the opening. As a result, the micro valve unit can be used as a conveyor apparatus where an article to be conveyed on the openings is transferred from a place to another place to regulate its position by the corrugated alteration of the pressure at the upper position of the openings, using the pressure in the micro valves. A lightweight article to be conveyed, such as a paper, can be conveyed without any contact therewith in a floating state, and therefore such a conveyor apparatus can preferably be used for conveying printed matters whose printed surface is not preferable to be used as a holding portion.

Figure 7A:
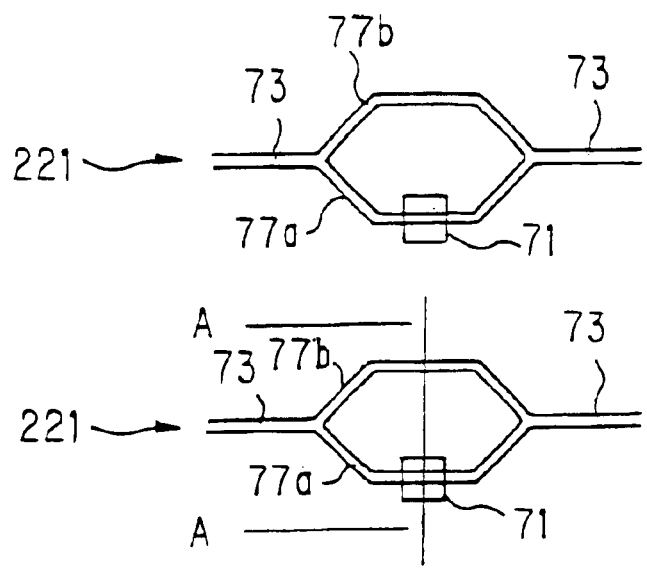
FIGS. 7(a) and (b) show an example of application of a matrix type P/E actuator according to the present invention, where
Figure 7B:
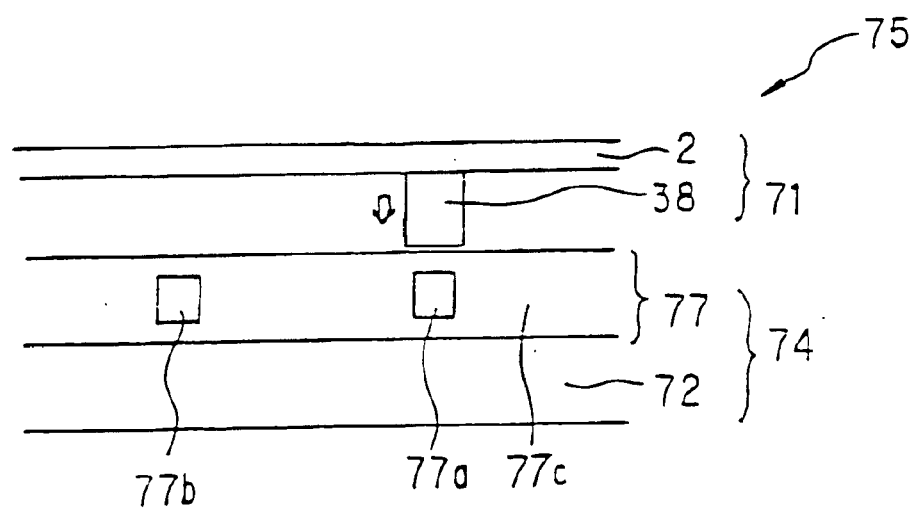
FIG. 7(b) is a sectional view viewed from A—A in FIG. 7(a).

FIGS. 7(*a*) and (*b*) show an embodiment of an optical modulator formed by combining a matrix type P/E actuator according to the present invention and an optical interferometer, where FIG. 7(*a*) shows an upper part of the optical interferometer and FIG. 7(*b*) shows a cross section viewed from line A—A in FIG. 7(*a*). The optical interferometer 74 includes two directional couplers 73 and two arm-shaped optical wave guide cores 77*a* and 77*b* connected thereto. The optical modulator 75 includes actuators 71 for providing a stress to at least a part in one of the optical wave guide cores 77*a* and 77*b* in the optical interferometer 74.

As shown, for instance, in FIG. 7(*b*), an actuator 71 is disposed, which faces the optical wave guide core 77*a* in an optical wave guide 77 (for instance, a quartz wave guide or a wave guide made of polymer, such as polyimide) comprising a cladding 77*c* and the optical wave guide cores 77*a* and 77*b* on a substrate (for instance, silicon). Two structural arrangements are possible; one of which includes an air gap between the actuator 71 and the optical wave guide 77, and a stress is transferred between them by coming into contact them with each other in a possible necessary case, whereas the other of which includes no air gap between them, so that the stress can be directly applied between them.

The modulation of light is carried out in such a manner that the application of a stress to the optical wave guide core 77*a* provides a change in the refractive index of the core and thereby generates a phase difference between two beams of light which propagate respectively in the arm-shaped optical wave guide cores 77*a* and 77*b*, thus providing light intensities in accordance with the phase difference. If, therefore, one sets phase difference at a specified level, two values corresponding to the elimination of propagating light (OFF) and the occurrence of light (ON) can be out put.

Accordingly, if these optical modulators are arranged in two dimensions, the switching of the light transmission channels can be achieved using the above-mentioned ON/OFF mechanism. The matrix type P/E actuator according to the present invention has a basal portion and is constituted as a planar body. Therefore it may be advantageously arranged so as to face it to the two dimensionally arranged optical interferometers. A greater displacement in the matrix type P/E actuator according to the present invention does not require any high accuracy in setting the air gap. Although a relatively large stress is required in order to provide a change in the refractive index of the optical wave guide core, this may easily be attained by the greater generating force of the matrix type P/E actuator according to the present invention.

In addition, in such a change in the refractive index is used the one having thermo-optical effect of a material for an optical wave guide. However, the one using such heat needs a mechanism for removing heat to reduce cross talk and to enhance responsive speed. Further, it is sometimes forced, for example, to restrict its use in air-conditioned (e.g. cooled) room in order to prevent a faulty operation due to the raise in temperature of the switch itself. Since such a restriction is eliminated and no heat source is required if the refractive index is controlled by a stress, one may provide a switch having an advantage in view of consumption of an electric power.

Figure 2A:
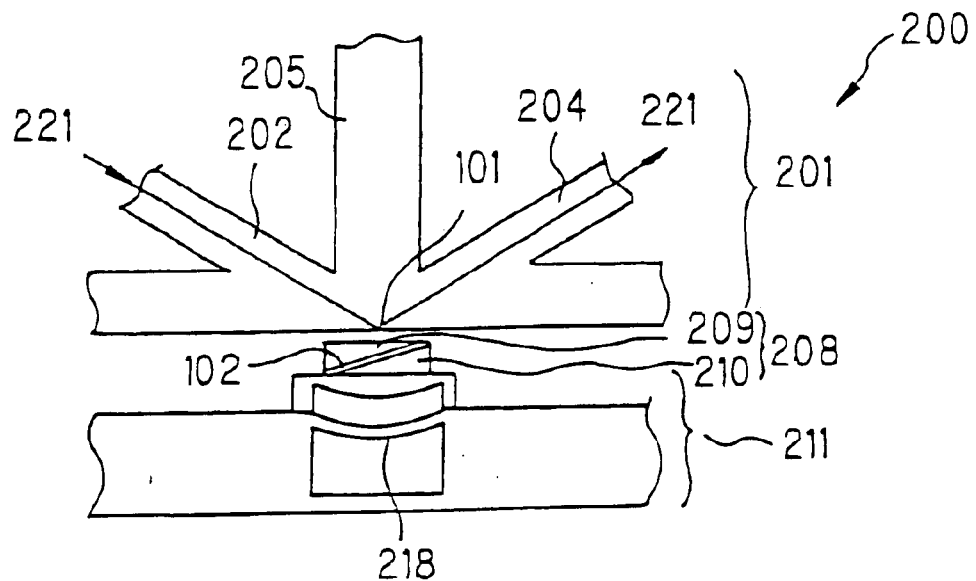
FIGS. 2(a) and (b) are vertical sectional views of a conventional piezoelectric/electrostrictive actuator in an application, where
Figure 2B:
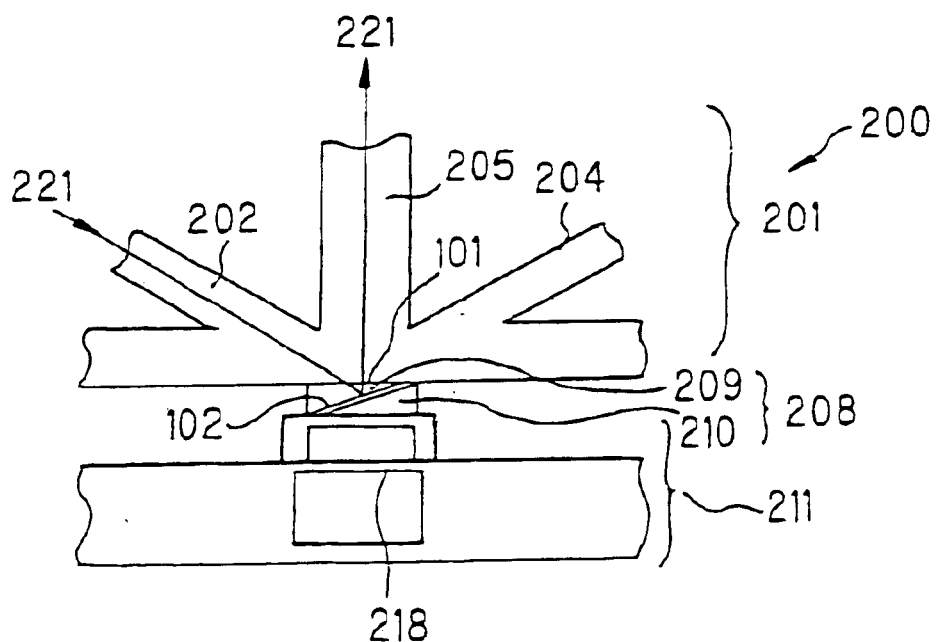
FIG. 2(b) shows the non-activated state in the application of the optical switch.

The matrix type P/E actuator according to the present invention can be employed as an actuator member in the optical switch 200 in FIGS. 2(*a*) and (*b*), instead of the actuator member 211 shown therein. The optical switch 200 shown in FIGS. 2(*a*) and (*b*) comprises the light transmitting member 201, the light path changing member 208 and the actuator member 211. The light transmitting member 201 further includes the light reflecting plane 101 disposed in a part of the surface facing the light path changing member 208 and the light transmitting channels 202, 204, and 205 directed in three different directions from the light reflecting plane 101. The light path changing member 208 includes the transparent light incident member 209 movably approaching the light reflecting plane 101 in the light transmitting member 201, and the light reflecting element 210 for reflecting the light by the total reflection. Moreover, the actuator member 211 includes the mechanism for transmitting the displacement caused by the external signal to the light path changing member 208, so that the light path changing member 208 comes into contact with the light reflecting plane 101 in the light transmitting member 201 or separates therefrom by means of the activation of the actuator member 211, and therefore the light 221 incident in the light transmitting channel 202 can be reflected at the light reflecting plane 101 in the light transmitting member 201 by the total reflection and then transmitted to a specific light transmitting channel 204 on the output side, or the light 221 incident in the light transmitting channel 202 can be received by the light incident member 209 and is reflected at the light reflecting plane 102 in the light reflecting member 210 by the total reflection, and then transmitted to a specific light transmitting channel 205 on the output side. In such an optical switch, the matrix type P/E actuator according to the present invention can be employed, instead of the actuator member 211 generating a bending displacement, so that an optical switch providing high contrast and low power loss can be achieved.

Figure 29:
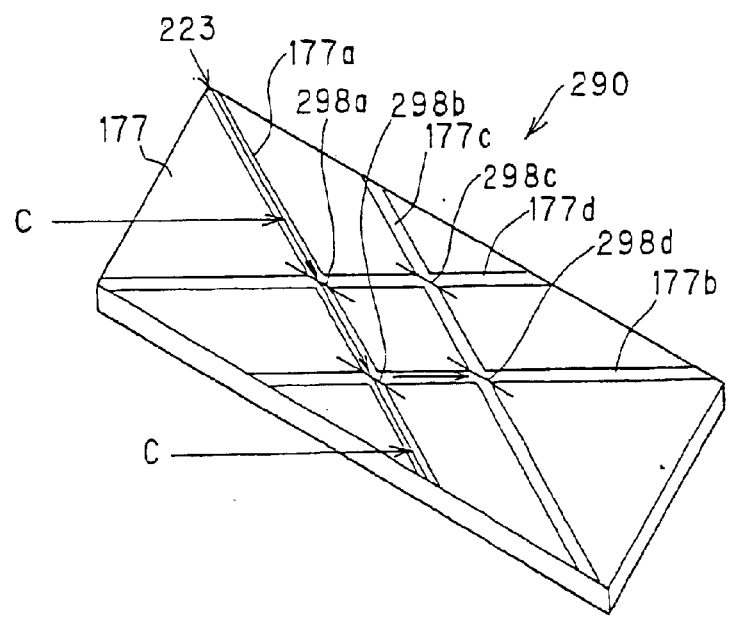
FIG. 29 is a perspective view of an optical switch as another example of application of the matrix type P/E actuator according to the present invention.

Another embodiment of an optical switch employing a matrix type P/E actuator of the present invention as an actuator member is hereinbelow described. The optical switch 290 shown in FIG. 29 is the one disclosed on page 182 of Proceedings for the annual meeting in 2001 of the Electronics Society, The Institute of Electronics, Information and Communication Engineers. The optical switch 290 is formed so that the optical wave guide member 177 and the optical wave guide cores 177*a* and 177*d* cross each other, and a cut is formed in the light path changing members 298*a*–298*d*, which is at the cross section. The optical switch 290 is a matrix switch which forms optically discontinuous portions by transforming the cut using a motion of a driving mechanism such as an actuator, so that a channel for transmitting the light input in one of the optical wave guide cores 177*a* and 177*d* can be changed at the light path changing members 298*a*–298*d*. Incidentally, FIG. 29 shows a state of changing the channel for transmitting the light 223 input in the optical wave guide core 177*a* to the optical wave guide core 177*b* at the light path changing member 298*b*.

In the optical switch 290, it is important to open the cut in the light path changing members 298a–298d to be wider so as to make the cross talk small. For this purpose, a large displacement is required for the actuator member (driving mechanism). It is also important that the light path changing members 298a–298d can excellently reproduce an optically discontinuous condition and continuous condition. For this purpose, it is preferable to employ a material having a relatively high Young's modulus to advantageously restore motion of the cut in the light path changing members 298a–298d. Therefore, the actuator member is required to have a large generating force to give a strain to the material having a high Young's modulus. Further, since the optical wave guide cores 177a and 177d is generally formed by a photolithography method capable of forming a pattern having high accuracy and high integration, the actuator member is required to have high positional accuracy and high density.

A matrix type P/E actuator of the present invention has a large generating force since it directly makes use of an electric field induced strain of the piezoelectric/electrostrictive elements. In addition, since the piezoelectric/electrostrictive elements can easily have a high aspect ratio in a matrix type P/E actuator of the present invention, the generated displacement can be made large. Further, since the piezoelectric/electrostrictive elements are not bonded to the ceramic basal portion but unitarily structured in the form of a matrix, a size deviation and an inclination are so small that a structure having high density can easily be realized. Accordingly, a matrix type P/E actuator of the present invention is suitable as an actuator member for the optical switch 290.

Figure 30:
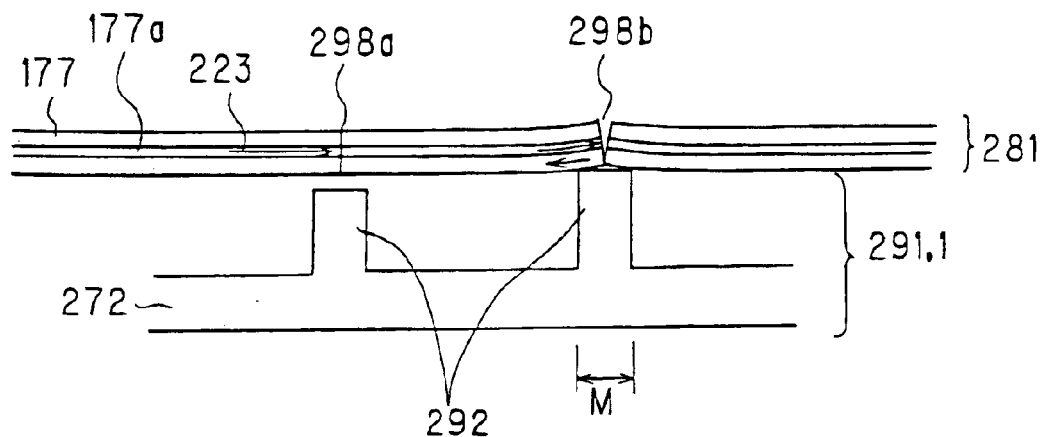
FIG. 30 is a vertical sectional view viewed from C—C in FIG. 29 of an optical switch as an example of application of the matrix type P/E actuator according to the present invention.

FIG. 30 shows a C—C section of the optical switch 290 shown in FIG. 29. The C—C section shows the light transmitting member 281 having the optical wave guide core 177a and the actuator member 291 having the piezoelectric/electrostrictive element 291. A matrix type P/E actuator 1 shown in, for example, FIG. 1 is employed as the actuator member 291 and disposed so as to correspond to the light path changing members 298a–298d. Embodiments of a matrix type P/E actuator applied to the actuator member 291 of the optical switch 290 are hereinbelow described with an Example. Any of the embodiments of a matrix type P/E actuator of the present invention may be applied to the actuator member 291.

In the state of the optical switch 290 shown in FIG. 30, the piezoelectric/electrostrictive element 292 of the actuator member 291 is in a non-operation state at the light path changing member 298a, and not acting on the optical wave guide core 177a. Therefore, the cut in the light path changing member 298 is closed, and the optical wave guide core 177a maintains an optically continuous state. At this time, the incident light 223 goes straight through the light path changing member 298a.

The piezoelectric/electrostrictive element 292 of the actuator member 291 is in an operation state at the light path changing member 298b, making the displacement and the stress act on the optical wave guide core 177a, thereby opening the cut in the light path changing member 298b. That is, the optical wave guide core 177a is optically discontinuous in the light path changing member 298b, and the incident light 223 is totally reflected and transmitted to the optical wave guide core 177b.

The operating state or the non-operation state of the actuator member (piezoelectric/electrostrictive element) and the presence or absence of the action to the optical wave guide core may be opposite to the aforementioned case. That is, there may be the case that the operation state of the actuator member does not cause the action (the state of the light path changing member 298a in FIG. 30) and the non-operation state of the actuator member causes the action (the state of the light path changing member 298b in FIG. 30). The piezoelectric/electrostrictive element acting on the light path changing members having smaller size M (shown in FIG. 30) is more preferable within a range of not hindering the action to open and close the cut in the light path changing members because a displacement amount required for the piezoelectric/electrostrictive element is reduced.

Figure 31:
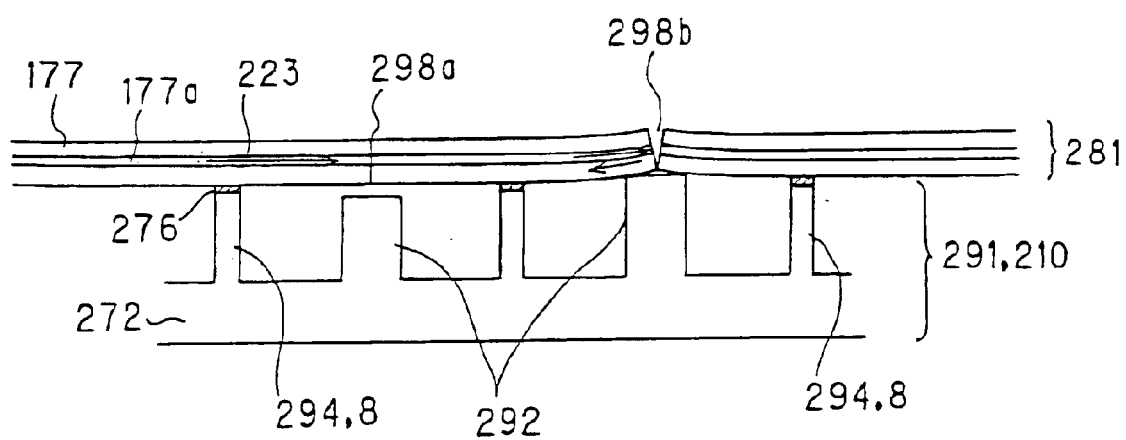
FIG. 31 is a perspective view of still another embodiment of an optical switch as an example of application of the matrix type P/E actuator according to the present invention.

FIG. 31 shows an example where the matrix type P/E actuator 210 shown in FIG. 21 is applied. The wall 8 of the matrix type P/E actuator 210 functions as the optical wave guide supporting member 294, which enables to reduce an amount of displacement required for opening and closing the cut in the light path changing members 298a–298d. That is, the cut may be opened, even if the displacement amount required for the piezoelectric/electrostrictive element 292 of the actuator member is small. This is because the radius of curvature for the opening of the cut at the light path changing members 298a to 298d becomes small. Further, since this advantage gives a margin to the opening operation of the cut, a leakage and a loss of signals due to the switching are preferably reduced.

Figure 32:
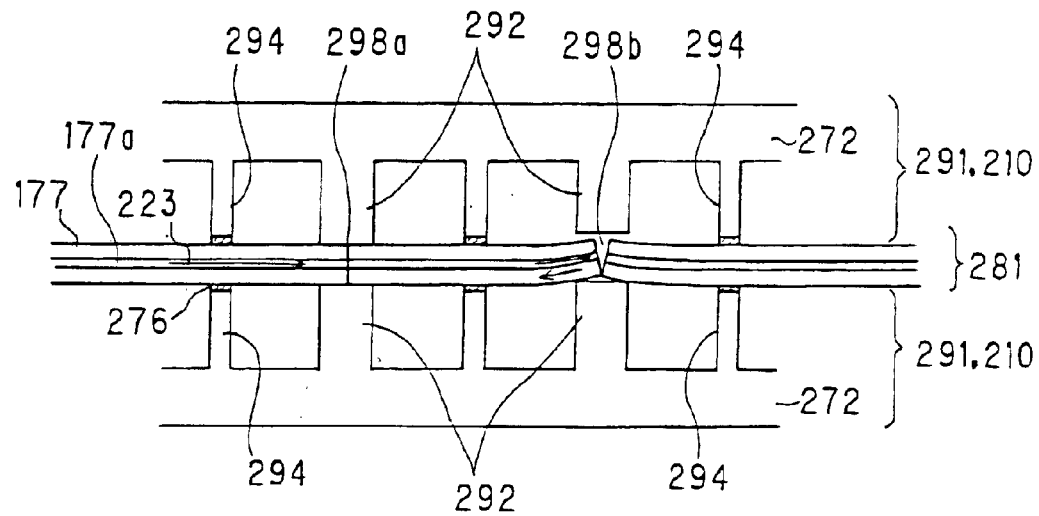
FIG. 32 is a perspective view of still another embodiment of an optical switch as an example of application of the matrix type P/E actuator according to the present invention.

FIG. 32 shows an example where an actuator member is provided on each of the both surfaces (top and bottom) of the optical wave guide member. As an embodiment of a matrix type P/E actuator applicable to the actuator member 291 may be any of all the matrix type P/E actuators of the present invention. For example, the matrix type P/E actuator 210 shown in FIG. 21 may preferably be employed. Thus, the provision of the actuator members 291 on both the top and the bottom of the optical wave guide member 177 enables to improve accuracy in closing the cut in the light path changing member and to enhance a responsive speed due to switching.

In the case that an actuator member is provided on only one surface of the optical wave guide member as shown in FIGS. 30 and 31, changes in the state from the opening to the closing of the cut in the light path changing member is in accordance with an elastic restoring force of the material to be used for the optical wave guide member. Therefore, if a soft material is used for the optical wave guide member, the restoration (the above changes in the state) takes relatively long time. Since this influences upon the time spent till the next switching operation, the quicker restoration is more preferable. Restoration means that the material is restored to the optically continuous state. It is prone to cause increase in leakage and/or loss of signals by a lowering of restoration accuracy due to deterioration of the material particularly in the case that operation is conducted for a long time.

However, in the case that actuator members are provided on both surfaces of the optical wave guide member as shown in FIG. 32, such a problem can be solved by compulsorily holding the cut in the light path changing member with an operation of the piezoelectric/electrostrictive element 292 of the actuator members 291 disposed in both of the up and down directions with respect to the cut in the light path changing member. That is, pressing the optical wave guide member 177 from both of the surfaces enables to maintain accuracy in closing and to carry out changes in the state from opening to closing at the responsive speed of the actuator members 291 (piezoelectric/electrostrictive element 292). Therefore, the structure for providing actuator members to both of the surfaces of the optical wave guide member is of advantage to the realization of a high-speed switch with low loss and low leakage.

Figure 33:
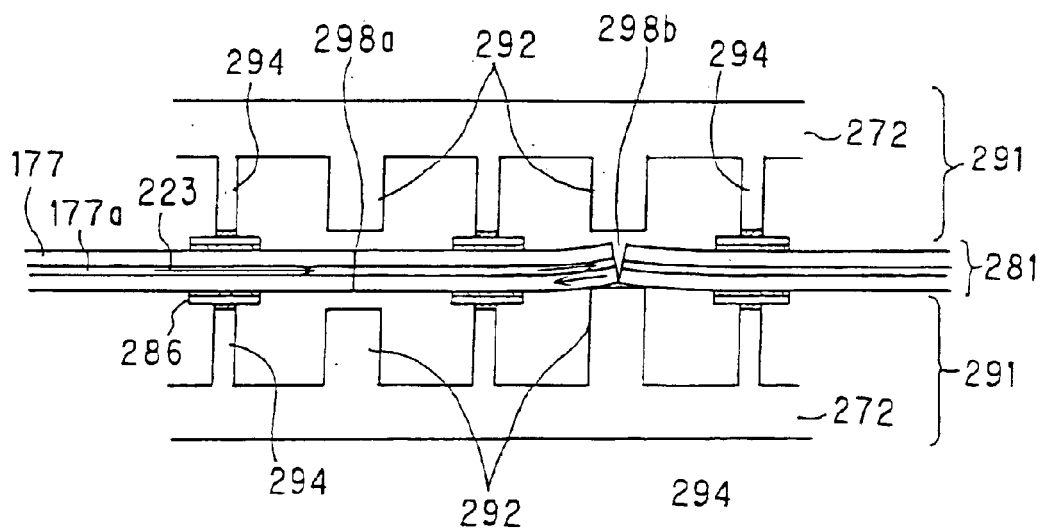
FIG. 33 is a perspective view of still another embodiment of an optical switch as an example of application of the matrix type P/E actuator according to the present invention.

The optical switch shown in FIG. 33 is almost the same as the example shown in FIG. 32, with the difference in bonding the actuator member 291 and the optical wave guide member 177 via the optical wave guide fixing plate 286 having higher rigidity between the wall 8 constituting the actuator member 291 and the optical wave guide member 177. According to this structure, flatness in the optical wave guide core improves, a gap between the upper surface (operating surface) of the piezoelectric/electrostrictive element 292 of the actuator member 291 and the optical wave guide member 177 can be maintained with high accuracy, and accuracy in the operation of the switch can be enhanced. Incidentally, it is not required that the actuator members 291 disposed on the top and bottom surfaces of the optical wave guide member 177 in FIGS. 32 and 33 mutually are in the same configuration. For example, it is possible to dispose the matrix type P/E actuator 1 shown in FIG. 1 on the top and the matrix type P/E actuator 210 shown in FIG. 21 on the bottom.

Figure 34:
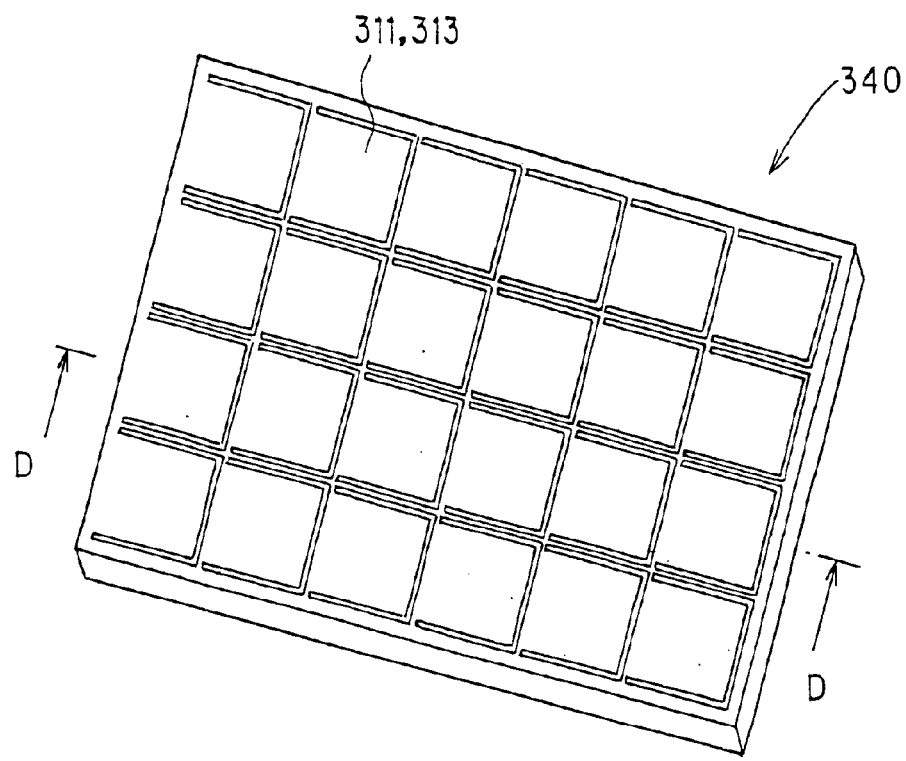
FIG. 34 is a perspective view of an embodiment of a light reflection apparatus as an example of application of the matrix type P/E actuator according to the present invention.
Figure 35:
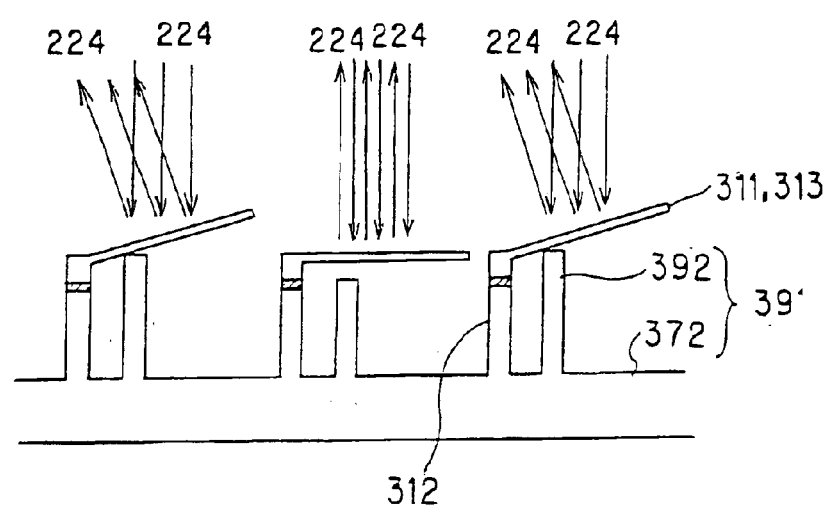
FIG. 35 is a partial vertical sectional view viewed from D—D in FIG. 34 of an embodiment of a light reflection apparatus as an example of application of the matrix type P/E actuator according to the present invention.
Figure 36:
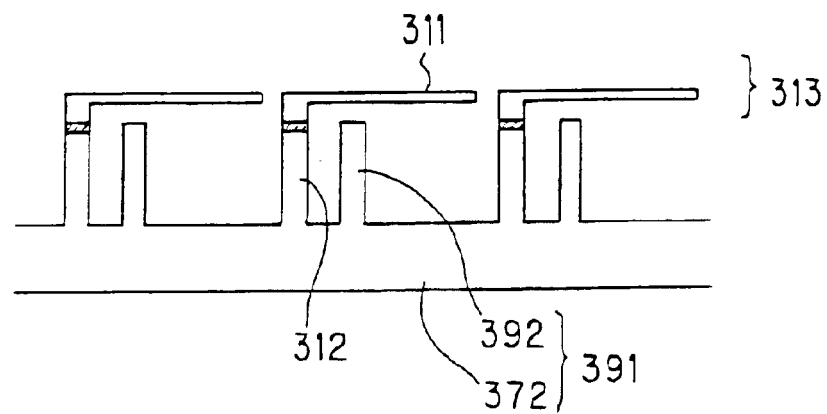
FIG. 36 is another partial vertical sectional view viewed from D—D in FIG. 34 of an embodiment of a light reflection apparatus as an example of application of the matrix type P/E actuator according to the present invention.

A light-reflection mechanism where a matrix type P/E actuator of the present invention is applied is hereinbelow described. FIG. 34 is a perspective view showing an embodiment of a light-reflection mechanism. FIGS. 35 and 36 show a part of the D—D section of the light-reflection mechanism shown in FIG. 34, each of which shows a state of a certain operation. The light-reflection mechanism 340 is used for a projector, an optical switch, etc.; and a matrix type P/E actuator of the present invention may suitably be employed as its actuator member 291.

The light-reflection mechanism 340 has the light reflecting portion, where light reflecting plates 311 of micro mirrors or the like are lined up in the form of a matrix, and the actuator member 391. The piezoelectric/electrostrictive element 392 is disposed in a position opposite to each of the light reflecting plates 311. For example, a matrix type P/E actuator of the present invention, which is represented by a matrix type P/E actuator 210 shown in FIG. 21 and which has a wall, is used as an actuator member 391, and an end of a light reflecting plate 311 is supported by a light reflecting plate supporting member 312, which is the wall thereof. Then, by the operation of the actuator member 391 (piezoelectric/electrostrictive element 392), the light reflecting plate 311 forms an angle of inclination with the light reflecting plate supporting member 312 to change a reflecting angle of the incoming light 224. Depending on the presence or absence of the reflecting angle, color formation of each pixel is conducted in the case of a projector, and a channel for transmitting signals is switched in the case of an optical switch.

As embodiments shown in FIGS. 34–36, an actuator member using a matrix type P/E actuator of the present invention has the same pitch between adjacent piezoelectric/electro-strictive elements 392 and between the walls constituting the light reflecting plate supporting member 312. However, the actuator member may have a structure having different pitches between the piezoelectric/electrostrictive element 392 and an adjacent wall as shown in the figures. It is a matter of course that the piezoelectric/electrostrictive elements 392 are not necessarily lined up with the same pitch.

Since a matrix type P/E actuator of the present invention applied to the actuator member can have a large generating force, a light reflecting plane excellent in flatness can be structured with a light reflecting plate having high rigidity being applied, thereby giving a more preferable light-reflection mechanism. Further, since the distance between the wall (light reflecting plate supporting member) and the piezoelectric/electrostrictive element can be made smaller as the advantage of the generating force, a reflection mechanism having a large reflecting angle can be easily realized.

Incidentally, the light-reflection mechanism is not limited to the embodiments of the light-reflection mechanism 340 shown in FIGS. 34–36. There may be alternatively employed the one where a reflecting angle is changed by displacing a part of the light reflecting plate by the operation of the piezoelectric/electrostrictive element without bonding the actuator member to the light reflecting portion. In addition, either of a shrinkable piezoelectric/electrostrictive element and an extensible one may be employed as an actuator member.

In addition to the aforementioned embodiments, a matrix type P/E actuator of the present invention can be used for a device for conducting mixing, agitation, reaction, etc., of a liquid and a liquid, a liquid and a solid, or a liquid and a gas with a very small amount and in a very small area by the use of functions based on the displacement and vibrations.

In the following, the method for manufacturing the matrix type P/E actuator according to the present invention will be described. Though various kinds of methods may be employed such as a ceramic green sheet lamination method, a machining method, e.g., a wire saw method and a dicing method in the production; it is preferable to employ the ceramic green sheet lamination method described below in combination with a punching process using a die and a punch. An example of the process employed in the method for manufacturing the first matrix type P/E actuator according to the present invention is schematically shown in FIGS. 14(a) to (f). In this case, the method for manufacturing, for instance, the matrix type P/E actuator 120 shown in FIG. 12 will be described. Firstly, a predetermined number of ceramic green sheets 16 (hereafter being simply referred to as sheets) having the below-described piezoelectric/electrostrictive material as a main component are prepared. These sheets can be produced by the conventional method for producing a ceramics. A powder of the below described piezoelectric/electrostrictive materials is prepared, and by adding a binder, solvent, dispersing agent, plasticizer and the like thereto, a slurry having desired components is produced, and then a ceramic green sheet is produced after the treatment of degassing therein with a sheet forming method, such as the doctor blade method, the reverse roll coating method, or the like.

In FIG. 14(a), each ceramic green sheet 16 is machined with a punch and a die, and slit apertures 15 are formed in each green sheet 16. A predetermined number of these sheets are laminated and then compressed against each other, and after that a ceramic green sheet lamination structure 301 having a predetermined thickness and slits 5, where it includes a piezoelectric/electrostrictive material as a main component, is formed, as shown in FIG. 14(b). On the other hand, a predetermined number of plate-shaped ceramic green sheets, which are machined in a predetermined external shape and contain a piezoelectric/electrostrictive material similar to the above, are prepared, and similarly laminated and compressed against each other, thereby, the part of the ceramic substrate being formed as a ceramic green substrate 302. The ceramic green lamination structure 301 and the ceramic green substrate 302 are adjusted into a desired position, and then they are laminated and compressed against each other. Thereby, a sintered lamination structure 303 can be obtained after sintering and unifying (FIG. 14(c)).

Subsequently, electrodes 18 and 19 are formed, as shown in FIG. 14(d), and unnecessary parts are removed by cutting them along cutting lines 350 or slicing lines 351 with a dicing process, slicing process, wire-sawing process or the like, as shown in FIG. 14(e), thus enabling individual piezoelectric/electrostrictive bodies 4 to be obtained, as shown in FIG. 14(f). Incidentally, it is preferable to employ a wire saw method among the aforementioned methods in view of a quality of processing (presence or absence of dropped out granules, cracks). The same applies to the embodiment described below. Finally, the matrix type P/E actuator 120 is provided after performing the polarization treatment in accordance with the necessity. In the machining of cutting and removing, it is preferable that the slits 5 are filled with a removable resin or the like in advance, thereby enabling the damages to be suppressed in the machining process.

In the method of positioning the ceramic green sheets 16 in the process of lamination, the positioning is carried out either by sequentially stacking the ceramic green sheets 16, for instance, inside a frame having an inner space whose shape is approximately identical with the outer shape of the ceramic green sheets 16, by sequentially stacking the ceramic green sheets 16, in which case a guide pin is passed through a hole of each sheet, which is formed in advance, or by sequentially stacking the ceramic green sheets 16 with the predetermined number of guide pins having the same shape as the slits being lined up at a predetermined pitch to pass through the slits itself as guide holes. After that, the ceramic green lamination structure 301 can be formed by compressing under heating. In this case, the plane plates shown in FIGS. 9 and 11 can also be formed from the same material and can be laminated, compressed, and then sintered to be unified. In the above method, the ceramic green lamination structure 301 and the ceramic green substrate 302 are separately formed by the lamination, and then further combined by the lamination. However, it is possible to simultaneously laminate all of the green sheets 16. These procedures can be applied as a modified one in the manufacturing methods described below.

Moreover, it is more desirable that a simultaneous punching and laminating procedure is employed in the method of laminating and positioning the ceramic green sheets 16. The simultaneous punching and laminating procedure means a method of producing a ceramic green lamination structure 301 having a predetermined thickness and containing piezoelectric/electrostrictive material in which slits 5 are formed, where slit apertures 15 are formed in the ceramic green sheets 16 in FIG. 14(a), and at the same time the sheets 16 are laminated with the method mentioned below, and slit apertures 15 are formed, thereby the lamination is completed together with the completion of punching.

FIGS. 18(a) to (e) show a concrete method of simultaneously punching and laminating, wherein a stripper 11 for laminating the sheets 16 is disposed around the punch and a die assembly consisting of a punch 10 and a die 12 is used. FIG. 18(a) shows a state in which a first sheet 16a is placed on the die 12 before punching, and in FIG. 18(b), the punch 10 and the stripper 11 is moved downwards, and thus slit apertures are punched in the sheets 16 (first substep).

Subsequently, a second sheet 16b is ready for punching. In this case, as shown in FIG. 18(c), the first sheet 16a is moved upwards in contact with the stripper 11, and thus removed from the die 12 (second substep). The method in which the sheet 16 comes into contact with the stripper 11 can be realized by providing suction holes in the stripper 11 and by vacuum-evacuating the air and the like therethrough.

In order that the second sheet 16b is ready for punching, the punch 10 and the stripper 11 are moved upwards. In the course of the upward movement, it is desirable that the front ends of the punch 10 are not returned inside the slit apertures of the first sheet 16a, and in the procedure of stopping the movement, it is important to stop the front ends at a position at which the front ends are withdrawn slightly from the lowest part of the first sheet 16a (third substep). If the punch 10 is returned to the inside of the apertures of the first sheet 16a or completely inserted into the stripper 11, the apertures are deformed due to the softness of the sheet 16, and therefore the flatness of the side surfaces of the slits 5 is deteriorated in the course of forming the slit 5 by laminating the sheets 16.

FIG. 18(d) shows the process of punching the second sheet 16b. In this case, the second sheet 16b can easily be placed on the die 12 with the procedure in which the first sheet 16a comes into contact with the stripper 11, and therefore the punching can be carried out as in the process of FIG. 18(b), and, at the same time, can be stacked on the first sheet 16a (fourth substep).

By repeating the substeps in FIGS. 18(c) and 18(d), the second sheet 16b is placed on the first sheet 16a punched, and then they are moved upwards (fifth substep). After that, the third sheet 16c is ready for punching. In this case, it is important to stop the punch 10 at the position where it is withdrawn slightly from the front ends of the sheet 16 moved upwards together it (sixth substep). After that, by repeating the fourth substep to the sixth substep, a required number of laminated sheets 16 are repeatedly punched and laminated.

FIG. 18(e) shows the state in which the punching is completed. After a required number of sheets 16 are punched and laminated, the holding of the sheets 16 with the stripper 11 is released, and the sheets 16 thus punched can be removed from the stripper 11. Removing from the stripper can be securely carried out by the removing tool 17 disposed at the lower surface of the stripper 11, as shown in the drawing. The above-mentioned procedure corresponds to the manufacturing method, which is disclosed in Japanese Patent Application No. 2000-280573. With this procedure, the ceramic green lamination structure having a predetermined thickness and slits formed therein are formed, can be obtained.

Figure 19A:
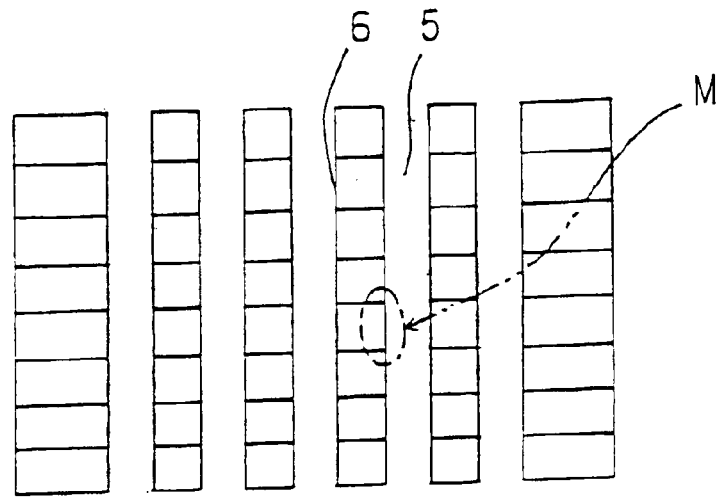
FIGS. 19(a) and (b) are drawings for explaining the method for manufacturing the matrix type P/E actuator shown in FIGS. 14(a) to (f), where
Figure 19B:
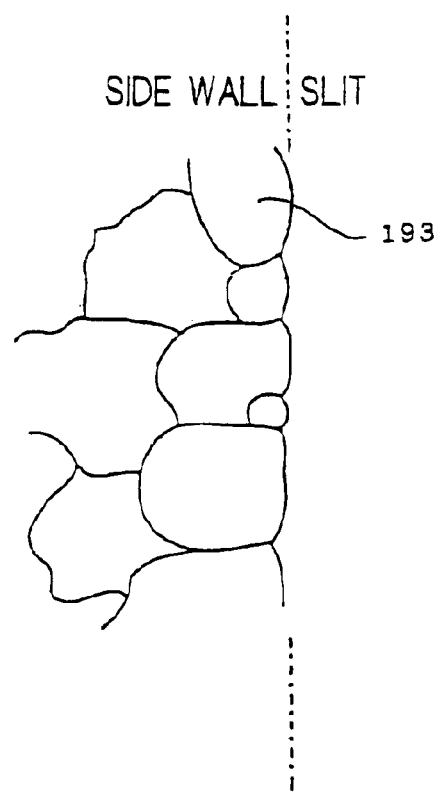
Figure 20A:
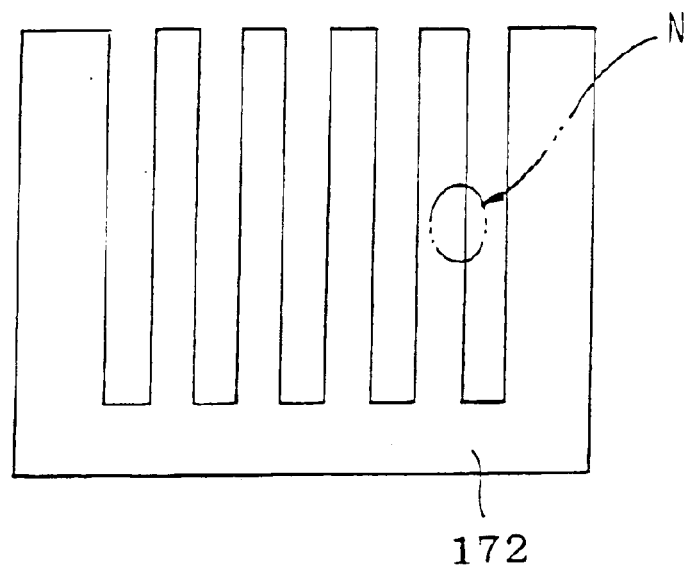
FIGS. 20(a) and (b) are drawings for explaining the conventional method for manufacturing a piezoelectric/electrostrictive actuator in which the slit machining is carried out after sintering, where

FIG. 19(a) shows a vertical section of a sintered lamination structure 303 formed in the process of FIG. 14(c), viewing from point B, where the lamination structure is formed by using the simultaneous punching and laminating procedure with the punch and the die, and FIG. 19(b) schematically shows a magnified sectional view of part M in the wall surface of the slit 5 shown in FIG. 19(a). FIG. 20(a) is a vertical sectional view of the sintered lamination structure 172 viewed from the side, where the sintered lamination structure 172 is produced by sintering and unifying ceramic green lamination structure having piezoelectric/electrostrictive material as a main component and then by machining the structure with, for example, a dicer to form slits, and FIG. 20(b) schematically shows a magnified sectional view of part N in FIG. 20(a).

Figure 20B:
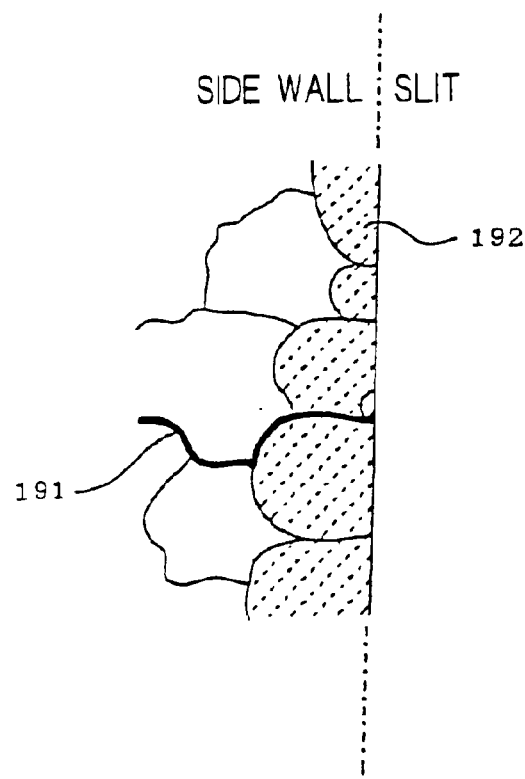
FIG. 20(b) shows a magnified section of part N in FIG. 20(a).

In the case of machining the lamination structure with the dicer to form slits after sintering on the lamination structure inclusive of piezoelectric/electrostrictive materials as a major component, micro cracks and/or transgranular fractures of the crystal grains shown in FIG. 20(b) occur, for instance, on the wall surfaces of the slits (micro cracks 191 and ceramic crystal grains 192 with transgranular fractures are shown in FIG. 20(b)). If, however, the matrix type P/E actuator is produced by forming the slits with the simultaneous punching and laminating procedure before sintering the lamination structure, the side walls of slits 5 which will later become side wall surfaces of the piezoelectric/electrostrictive bodies 4 are formed as sintered surfaces, and as shown in FIG. 19(*b*), neither micro cracks nor transgranular fractures occur. The condition of the ceramic crystal grains 193 in the surface of the side walls 6, which later become side walls as functional surfaces forming electrodes of the piezoelectric/electrostrictive bodies 4, is that the crystal grains suffering the transgranular fractures are less than 1%, i.e., being substantially the same as zero, and therefore no deterioration of properties occurs, thereby enabling the durability and the reliability to be enhanced.

In the present invention, in order to obtain individual piezoelectric/electrostrictive bodies 4, there is a case that the treatment such as, for example, the cutting treatment is carried out after sintering. However, the surfaces actually removed are not the surfaces on which electrodes are formed. As can be taken from the first matrix type P/E actuator, the machined surfaces are not the main surfaces for functioning the piezoelectric/electrostrictive elements, so that any effect can scarcely be suffered by such removed surfaces. Such a fear may be dissipated by the cutting treatment prior to the sintering.

Furthermore, if a matrix type P/E actuator is produced by using the simultaneous punching and laminating procedure, the degree of profile for the surface of the piezoelectric/electrostrictive bodies 4 can be set approximately less than 8 $\mu$m due to the occurrence of no deviation in stacking. As a result, the displacement and force can be generated with ease in the direction and the quantity to be intended, and therefore there is an advantage in which the properties of the piezoelectric/electrostrictive elements can be effectively used. In addition, because of its high degree of profile, it is characterized in that it shows high rigidity against the reaction received from the action of pressing, tapping, or the like with operating the piezoelectric/electrostrictive elements, and that it hardly has damages such as transgranular fractures or cracks even in a narrow and tall piezoelectric/electrostrictive element having a high aspect ratio. Moreover, it is possible to reduce the surface roughness Rt of the wall surfaces of the piezo-electric/electrostrictive bodies 4 down to approximately less than 10 $\mu$m. Since the wall surfaces of the piezoelectric/electrostrictive bodies 4 acting as an operating portion are smooth, the concentration of electric field or stress can hardly occurs, thereby enabling a more stable operation of activation to be realized for a long period of time.

In conjunction with the above, the degree of profile is specified in Japanese Industrial Standard B0621, "Definition and representation of geometrical deviation". The profile of a surface means a surface which is specified in such a manner that it has a functionally determined shape, and the degree of profile for a surface means the magnitude of the deviation of the surface profile from the geometrical profile which is determined by theoretically accurate dimensions.

An example of the accuracy in stacking the ceramic green sheets by the simultaneous punching and laminating procedure will be represented herein. In the case of laminating ten ceramic green sheets each having a thickness of 50 $\mu$m and a Young's modulus of 39 N/mm$^2$, after punching them so as to have a slit width of 50 $\mu$m and a thickness of the piezoelectric/electrostrictive bodies (T in FIG. 1) of 30 $\mu$m, the deviation between the layers after sintering is at best 4 $\mu$m and the surface roughness Rt is 7 $\mu$m, so that the side surfaces of the piezoelectric/electrostrictive bodies can be formed to become very smooth. In this case, the slit width after sintering was 40 $\mu$m due to the shrinkage in the sintering.

As described above, the simultaneous punching and laminating procedure ensures forming slit apertures in the ceramic green sheets using the punch and die, and at the same time, laminating the ceramic green sheets, in which case, the punch itself is used as an axis for positioning the ceramic green sheets in the lamination, so that the deformation of the slit apertures machined by the punch can be suppressed. As a result, no deformation of the slit apertures occurs, and the deviation between the laminated ceramic green sheets can be suppressed to be less than 5 $\mu$m, so that a lamination structure can be obtained with high accuracy, thereby enabling smooth and flat wall surfaces of the slits to be formed in the obtained lamination structure. Since there are substantially neither micro cracks nor transgranular fractures in crystal grains on the main side surfaces of the piezoelectric/electrostrictive bodies, no deterioration of the properties due to the residual compression stress occurs. Hence, even if many piezoelectric/electrostrictive bodies are arranged in the form of a matrix on the substrate, an actuator having excellent properties can be obtained.

In the case of constituting a piezoelectric/electrostrictive element having a high aspect ratio as shown in FIG. 28, it is preferable to manage so as not to cause deformation or damage on a wall (the portion finally serving as a piezoelectric/electrostrictive element or a wall) between slits in handling during the production process or the firing process. For example, in FIGS. 14(*b*) and 14(*c*), the slit opening on only one side is closed. However, it is also preferable to stack up ceramic green sheets also on the side opposite to the side where the ceramic green substrates 302 are stuck up so as to close the slits, and sinter the resultant.

At this time, it is necessary to take care that the closed slit is not in the sealed condition. Because, in the case that sintering is conducted in the sealed state, gas generated by decomposition or combustion of organic materials in the green sheets cannot be discharged from the slit, and cracks or the like are prone to be caused in the ceramic green lamination structure. Therefore, it is preferable to form a hole for degassing in the ceramic green sheet for closing a slit. Incidentally, in the case that a through hole is formed in a ceramic green substrate in accordance with wiring for driving the piezoelectric/electrostrictive element, degassing can be conducted through the through hole. Therefore, it is not necessary to machine a hole in the aforementioned ceramic green sheet for closing a slit, and after sintering, a closing portion (a part corresponding to a ceramic green sheet for closing the slit) is removed by grinding, or the like, to open the slit.

Figures 15A, 15B, 15C, 15D, 15E, 15F:
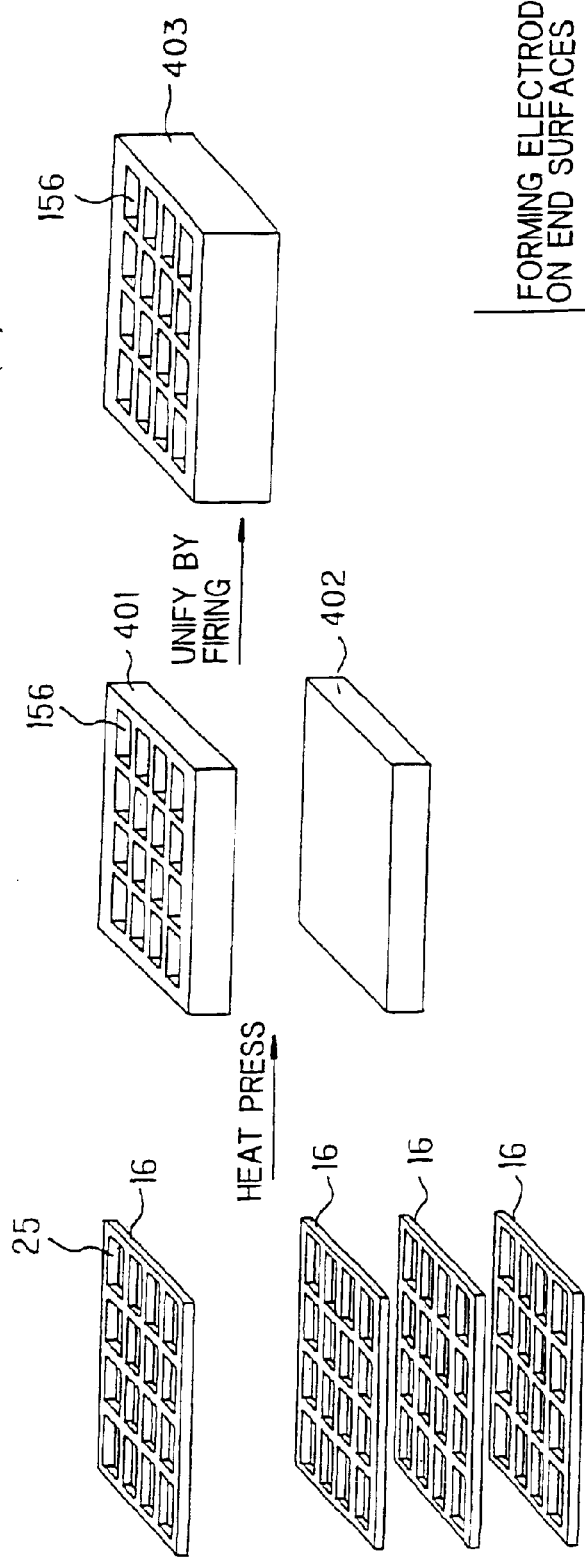
FIGS. 15(a) to (f) are drawings for explaining another manufacturing method for a matrix type P/E actuator according to the present invention.

Another example of a process in a method for manufacturing a matrix type P/E actuator is schematically shown in FIGS. 15(*a*) to 15(*f*), where the method for manufacturing, for example, a matrix type P/E actuator 100 shown in FIG. 10 is described. Firstly, a predetermined number of ceramic green sheets 16 containing a piezoelectric/electrostrictive material as a main component are prepared. In FIG. 15(*a*), each ceramic green sheet 16 is punched with a die and a punch, and square-shaped holes 25 are formed in each ceramic green sheet 16. By laminating and compressing these sheets, a ceramic green lamination structure 401 having a predetermined thickness is formed as shown in FIG. 15(*b*), where square-shaped openings 156 are formed in the ceramic green lamination structure 401 containing the piezoelectric/electrostrictive material as a main component. On the other hand, a part to be a ceramic substrate is formed as a ceramic green substrate 402 by preparing plate-shaped ceramic green sheets which have a predetermined size only for the external shape and contain the same piezoelectric/electrostrictive material and by laminating and compressing a predetermined number of the sheets.

The ceramic green lamination structure 401 and the ceramic green substrate 402 are laminated and compressed against each other after positioning. After that, a sintered lamination structure 403 can be produced by sintering and unifying them (FIG. 15(*c*)). Subsequently, as shown in FIG. 15(*d*), electrodes 18 and 19 are formed, and then unnecessary parts are removed by dicing machining, or slicing machining, or wire-saw machining them along cutting lines 350 or slicing lines 351, as shown in FIG. 15(*e*). Finally, individual piezoelectric/electrostrictive bodies 4 can be obtained, as shown in FIG. 14(*f*). After that, by performing the treatment of polarization in accordance with the necessity, a matrix type P/E actuator 100 can be obtained. In the machining of slicing and removing, it is preferable that the square-shaped openings 156 are filled with a removable resin or the like, thereby preventing the damage in the machining. As a method for positioning and laminating the ceramic green sheets 16, the above-mentioned simultaneous punching and laminating procedure can be preferably employed.

In the following, an example of a process of a method for manufacturing the second matrix type P/E actuator is schematically shown in FIGS. 16(*a*) to 16(*g*). Firstly, as ' shown in FIG. 16(*a*), a predetermined number of ceramic green sheets 16 containing piezoelectric/electrostrictive material as a main component are prepared. Except for one sheet of a top plate, an electrical conductor material for internal electrodes 48 is applied to remained half of the sheets remained by the screen printing method or the like, and ceramic green sheets 116 on which layered electrodes are formed can be obtained. Furthermore, an electrical conductor material for internal electrodes 49 is applied to half of the sheets remained by the screen printing method or the like, and ceramic green sheets 117 on which layered electrodes are formed can be obtained. In FIG. 16(*b*), the ceramic green sheets 16, 116 and 117 are each punched with the punch and the die and slit apertures 15 are thus formed in each of the green sheets 16, 116 and 117. As shown in FIG. 16(*c*), the ceramic green sheets 116 and 117 are alternately laminated each other, and then compressed. After that, a ceramic green lamination structure 501 having a predetermined thickness and slits 5 can be formed. On the other hand, a part to be a ceramic substrate is formed as a ceramic green substrate 502 by preparing plate-shaped ceramic green sheets which have a predetermine size only for the external shape and contains the same piezoelectric/electrostrictive material as a main component, and similarly by laminating and compressing a predetermined number of the sheets.

The ceramic green lamination structure 501 and the ceramic green substrate 502 are laminated and compressed against each other after positioning. After that, a sintered lamination structure 503 can be produced by sintering and unifying them (FIG. 16(*d*)). Subsequently, as shown in FIG. 16(*e*), electrodes 28 and 29 are formed, and then unnecessary parts are removed by dicing machining, or slicing machining, or wire-saw machining them along cutting lines 350 or slicing lines 351, as shown in FIG. 16(*f*). Finally, individual piezoelectric/electrostrictive bodies 4 can be obtained, as shown in FIG. 14(*g*). After that, by performing the treatment of polarization in accordance with the necessity, a matrix type P/E actuator can be obtained. In the machining of slicing and removing, it is preferable that the slits 5 are filled with a removable resin or the like, thereby preventing the damage in the machining. As a method for positioning and laminating the ceramic green sheets 16, 116 and 117, the above-mentioned simultaneous punching and laminating procedure can be preferably employed.

Another example of a process of a method for manufacturing the second matrix type P/E actuator are schematically shown in FIGS. 17(*a*) to 17(*g*). Firstly, as shown in FIG. 17(*a*), a predetermined number of ceramic green sheets containing piezoelectric/electrostrictive material as a main component are prepared. Except for one sheet of a top plate, a desired number of ceramic green sheets 113 are obtained by forming via holes 112 arranged in a predetermined spacing in the remained green sheets 16. In FIG. 17(*b*), an electrical conductor material for internal electrodes 48 is applied to half of the ceramic green sheets 113 with the screen printing method or the like, and further the via holes 112 are filled with the conductor material, thus obtaining ceramic green sheets 114. Moreover, an electrical conductor material for internal electrodes 49 is applied to remained half of the sheets with the screen printing method or the like and the via holes 112 are filled with the conductor material, thus obtaining ceramic green sheets 115. In FIG. 17(*c*), the ceramic green sheets 16, 114 and 115 are each punched with the punch and the die and slit apertures 15 are formed in each of the ceramic green sheets 16, 114 and 115. In FIG. 17(*d*), the ceramic green sheets 116 and 117 are alternately laminated together with the ceramic green sheet 16 each other and compressed, and thus a ceramic green lamination structure 601 having a predetermined thickness and slits 5 can be formed.

On the other hand, regarding a part to be a ceramic substrate, a desired number of ceramic green sheets, preferably made of the same material as the sheet 16 and in which via holes 118 filled with conductor material are formed are prepared, and by sequentially laminating these sheets and compressing, a ceramic green substrate 602 is formed. Subsequently, the ceramic green lamination structure 601 and the ceramic green substrate 602 are laminated with each other after positioning and compressed, and a sintered lamination structure 603 is formed by sintering and unifying them (FIG. 17(*e*)). Subsequently, unnecessary parts are removed with the dicing machining, slicing machining, wire-saw machining or the like along cutting lines 350 or slicing lines 351, as shown in FIG. 17(*f*), and thus individual piezoelectric/electrostrictive bodies 4 can be obtained, as shown in FIG. 17(*g*). After that, a treatment of polarization is carried out in accordance with the necessity, and thus a matrix type P/E actuator can be obtained. In the machining of slicing and removing, it is preferable that the slits 5 are filled with a removable resin or the like, thereby preventing the damage in the machining. As a method for positioning and laminating the ceramic green sheets 16, 114 and 115, the above-mentioned simultaneous punching and laminating procedure can be preferably employed.

In conjunction with the above, the formation of electrodes on the side surfaces of the piezoelectric/electrostrictive bodies can be carried out with the aid of sputtering, vacuum evaporation, CVD, plating, coating, spray or the like in the above-mentioned manufacturing methods shown in FIGS. 14, 15 and 16. In this case, it is important to perform the above treatment by masking in order to avoid a short circuit of the paired electrodes. Moreover, in the case that the initial height (under a state of the non-operation) of each piezoelectric/electrostrictive element is accurately adjusted to a fixed value, it is preferable to polish the elements before or after the cutting process shown in the drawings in order to enhance flatness of the activation surface so as to transmit effectively the action, or further to make the activation surface mirror-like, etc. When performing the process of polishing, the treatment of masking is not always necessary in the above-mentioned formation of the electrodes. For instance, a pair of electrodes can be produced by initially forming an electrode layer on the whole surface of the elements and then by cutting the electrode layer with the procedure of polishing. Accordingly, it is preferable since the formation of both activation surfaces and paired electrodes may be able to form simultaneously without masking.

Figure 22:
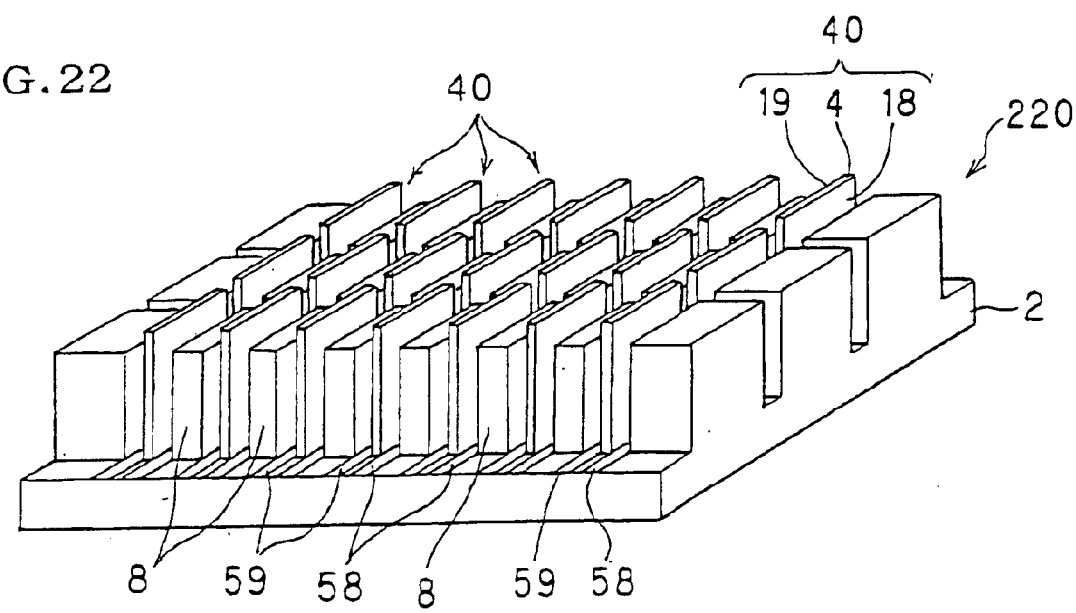
FIG. 22 is a perspective view of still another embodiment of a matrix type P/E actuator according to the present invention.
Figure 23:
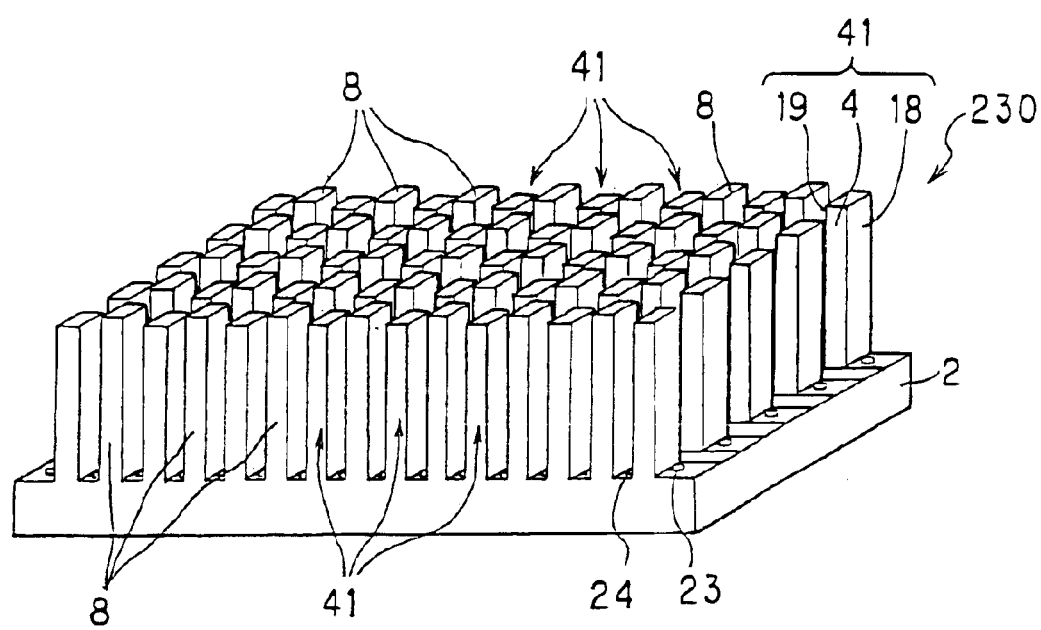
FIG. 23 is a perspective view of still another embodiment of a matrix type P/E actuator according to the present invention.

Incidentally, polishing may be employed for the purpose of forming an embodiment having different height between the wall and the piezoelectric/electrostrictive element as in the matrix type P/E actuator shown in FIGS. 22 and 23 besides the purpose of forming a pair of electrodes. That is, by forming a pair of electrodes and then conducting polish in a state that the piezoelectric/electrostrictive element is activated by applying a voltage to the pair of electrodes, there can be realized, for example, an embodiment like the matrix type P/E actuator shown in FIG. 22 if the pair of electrodes are applied to the first matrix type P/E actuator, which contracts in the activated condition, and an embodiment like the matrix type P/E actuator shown in FIG. 23 if the pair of electrodes are applied to the second matrix type P/E actuator, which expands in the activated condition.

In addition, since there is no relationship between the applied voltage and the thickness of the piezoelectric/electrostrictive element in the first matrix type P/E actuator according to FIGS. 14 and 15, unlike the second matrix type P/E actuator, a ceramic green sheet having a thicker thickness may be employed as far as the workability and the sectional shape of the punched shape at the time of punching are within a satisfactory range because of the thickness of the green sheet does not have a relation to the applied voltage. Therefore, the first matrix type P/E actuator may be said to be an advantageous structure from the man-hours viewpoints since the number of laminated sheets may be reduced.

In the above, the embodiments of the matrix type P/E actuator and the methods for manufacturing the actuator are described. Regarding the two dimensional arrangement, the cross angle between the lines in the arrangement can be set to be not 90°, but 30° or 45°, and therefore, can be determined in accordance with the aim and the type of the application. The thickness of the ceramic substrate might be within such a range that the substrate is not deformed with the maximum generating force of the piezoelectric/electrostrictive elements disposed thereon. In addition, it is also preferable to join another member to the ceramic substrate for the purpose of improving strength of the ceramic substrate, handleability of the actuator, etc. Moreover, the surface of the piezoelectric/electrostrictive element itself can be used as the activation surface of the piezoelectric/electrostrictive element. However, the surface of the piezoelectric/electrostrictive element, said surface being covered with an element made of another material, can be used as the activation surface in accordance with the hardness of an object suffering the action and the frequency of its usage. Regarding the electrode terminals for activating the respective piezoelectric/electrostrictive elements, the description is made exclusively on the terminals which are formed on the back surface of the piezoelectric/electrostrictive element. However, the terminals can be formed on the surface on which the piezoelectric/electrostrictive elements are disposed. Moreover, when the electrode terminals are formed on the back surface of the ceramic substrate, it also is desirable that a printed circuit board in which driver IC's for the piezoelectric/electrostrictive elements are assembled is mounted on the electrode terminals.

In the following, the materials used for the matrix type P/E actuator according to the present invention will be described. Firstly, the material for a piezoelectric/electrostrictive body as an activation member, that is, the piezoelectric/electrostrictive material will be described.

As a piezoelectric/electrostrictive material, any of the materials which provide an electric field induced strain such as the piezoelectric effect or the electrostrictive effect induced by an electric field can be employed. Either a crystalline material or an amorphous material can be used, and it is possible to use a semiconductor ceramics or ferroelectric ceramics or antiferroelectic ceramics. The material should be appropriately selected among them in accordance with the type of the application, and the material, which is either necessary or unnecessary for treating polarization, can also be employed. Moreover, the material is not restricted to a ceramic material, but a piezoelectric material made of a polymer such as PVDF (polyvinylidene fluoride) or the like, or a composite material of such a polymer and a ceramics can be used. In this case, however, the elements are produced not by sintering due to the thermal resistant property of the polymer, but by the heat treatment providing a thermosetting property to the polymer. However, by employing a ceramic material excellent in the point of material strength, the structure having a high aspect ratio, which is a characteristic of the present invention, may be conducted advantageously, and generated displacement and generated stress can be made to act effectively. Further, a ceramics excellent in material properties is preferable in cooperation with the structure with a high aspect ratio in giving a high performance piezoelectric/electrostrictive element even though driving at low-voltage.

As for a concrete example of ceramics, a ceramics such as lead zirconate, lead titanate, lead magnesium niobate, lead nickel niobate, lead zinc niobate, lead manganese niobate, lead antimony stannate, lead manganese tungustate, lead cobalt niobate, barium titanate, sodium bismuth titanate, bismuth neodium titanate (BNT system), potassium sodium niobate, strontium bismuth tantalate, or the like can be employed singly, or in the form of a mixture thereof or a solid solution thereof as a piezoelectric ceramics or electrostrictive ceramics.

These ceramics should preferably be a main component of a ceramics forming the piezoelectric/electrostrictive bodies and should be contained in the ceramics at more than 50 wt %. Regarding the material component having a greater electro-mechanical coupling factor and a greater piezoelectric constant, and a higher stability in the process of sintering, a material containing lead zirconate titanate (PZT system) as a main component, a material containing lead magnesium niobate (PMN system) as a main component, a material containing lead nickel niobate (PNN system) as a main component, a material containing a mixture of lead zirconate, lead titanate and lead magnesium niobate as a main component, a material containing a mixture of lead zirconate, lead titanate and lead nickel niobate as a main component, or a material containing sodium bismuth titanate as a main component is preferably used.

Moreover, a ceramics including one or more oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or the like in the above-mention material can be used. For instance, an addition of lanthanum and/or strontium to a main component of lead zirconate, lead titanate and lead magnesium niobate makes it possible to adjust the coercive electric field and the piezoelectric property.

As for antiferroelectric ceramics, a ceramics containing lead zirconate as a main component, a ceramics containing a mixture or a solid solution of lead zirconate and lead stannate as a main component, and lead niobate added thereto may be employed. Moreover, as for the material of ceramic substrate, all of the materials, which can be heat-treated or sintered together with the piezoelectric/electrostrictive bodies to unify them, can be used. It is preferable that the material has the same component as that of the piezoelectric/electrostrictive bodies to be unified, and it is more preferable that the material has the same component and the same composition thereof as that of the piezoelectric/electrostrictive bodies.

In conjunction with the above, if a greater mechanical strength is desired in designing piezoelectric/electrostrictive bodies as an activation part, it is preferable that the mean grain size in the crystal grains of the ceramics is 0.05 to 2 $\mu$m. This is due to an increase in the mechanical strength of the piezoelectric/electrostrictive bodies acting as an activation part. If a greater expansion/contraction property is desired in designing piezoelectric/electrostrictive bodies as an activation part, it is preferable that the mean grain size in the crystal grains of the ceramics is 1 to 7 $\mu$m. This is due to an increase in the expansion/contraction property.

As the material for components (cover plate, valve body and the like) joined to the piezoelectric/electrostrictive elements, it is desirable that the material has the same thermal expansion coefficient as the piezoelectric/electrostrictive bodies. In particular, it is preferable that the material is a ceramics and can be unified with the piezoelectric/electrostrictive bodies in the process of lamination and sintering. In this case, it is possible that the material is the same ceramic as the piezoelectric/electrostrictive bodies or different therefrom. In addition, it is not necessary to use a ceramics as for the material, because the preferable properties, such as hardness, required for its usage can be varied. For instance, a gum, an organic resin, an organic adhesive film, a glass, a metal and others can be used. Moreover, the material prepared by mixing a filler to the above-mentioned non-ceramic substances can be effectively used to suppress the shrinkage during the hardening. When a ceramics is employed, a stabilized zirconium oxide, aluminum oxide, magnesium oxide, titan oxide, spinel, mullite, aluminum nitride, silicon nitride, glass, or a mixture thereof may be used.

As the material for the electrodes, the useful material is varied according to the process. If the electrodes are fired together with the piezoelectric/electrostrictive material, it is necessary for the material to endure an oxidizing atmosphere at a high temperature, and therefore there is no limitation for the material so long as it satisfies the above requirements. For instance, metal or alloy can be used, and further a mixture of an insulating ceramics, such as zirconium oxide, hafnium oxide, titanium oxide, cerium oxide or the like and metal or alloy can be used. More preferably, an electrode material containing a noble metal having a high melting point, such as platinum, palladium, rhodium or the like, or an alloy such as sliver and palladium, silver and platinum, platinum and palladium or the like as a main component, or a mixture of platinum and substrate material or piezoelectric/electrostrictive material and/or a cermet material can favorably be used. In particular, a mixture of substrate material and a noble metal and a cermet may be suitably used as a material for filling up via holes of the ceramic substrate of the present invention because the material is prone not to cause the snapping of a wire even if the material is sintered together with the ceramic substrate and because bonding force with the ceramic substrate can be obtained.

Regarding the electrodes formed after sintering the piezoelectric/electrostrictive bodies, for instance, formed on the side surfaces of the piezoelectric/electrostrictive bodies in the first matrix type P/E actuator, the material should be solid a normal temperature. Including the above-mentioned materials, a metal such as aluminum, titanium, chromium, iron, cobalt, nickel, copper, zinc, niobium, molybdenum, rhenium, silver, tin, tantalum, tungsten, gold, lead or the like or an alloy thereof can be used.

The electrode is formed by sputtering, vapor deposition, CVD, coating, or the like, using these materials. It is also possible to obtain the electrode of an intended material by forming a film by coating or spraying with the use of an organic metal compound (resinate) containing an element of the material, and then subjecting the resultant to a heat treatment.

As described above in detail, in accordance with the present invention, the problems in the prior art can be solved, i.e., a matrix type piezoelectric/electrostrictive actuator which ensures providing a greater displacement with a lower voltage, a high responsive speed, and a greater generating force, and at the same time enhancing the mounting ability and the integration as well as a method for manufacturing such an actuator can be provided. The matrix type P/E actuator can be advantageously used in an optical modulator, an optical switch, an electrical switch, a micro relay, a micro valve, a conveyor apparatus, an image display apparatus such as a display, a projector, and the like, an image drawing apparatus, a micro pump, a droplet ejecting apparatus, a micro mixing apparatus, a micro stirring apparatus, a micro reaction apparatus, and the like.

What is claimed is:

1. A matrix type piezoelectric/electrostrictive actuator comprising a plurality of piezoelectric/electrostrictive elements, each including a piezoelectric/electrostrictive body and at least one pair of electrodes formed only on side surfaces of said piezoelectric/electrostrictive body, said side surfaces being formed as sintered surfaces, and each disposed on a ceramic substrate and having an upper surface plane that is generally perpendicular with respect to an upper surface plane of said ceramic substrate, wherein said piezoelectric/electrostrictive elements are joined to said ceramic substrate as respective unified bodies that are two-dimensionally arranged independently of each other, and said actuator is activated by displacement of said piezoelectric/electrostrictive bodies.

2. A matrix type piezoelectric/electrostrictive actuator according to claim 1, wherein a cross section of the piezoelectric/electrostrictive body in said piezoelectric/electrostrictive element is a parallelogram shape when viewed in a plane parallel to said substrate, and said electrodes are formed on side surfaces which includes a long side of the cross section of the piezoelectric/electrostrictive body.

3. A matrix type piezoelectric/electrostrictive actuator according to claim 1, wherein said piezoelectric/electrostrictive elements are expanded/contracted in a vertical direction to said upper surface plane of said ceramic substrate the displacement of said piezoelectric/electrostrictive bodies due to a transverse effect of an electric field induced strain.

4. A matrix type piezoelectric/electrostrictive actuator according to claim 1, wherein conditions of crystal grains in the side surfaces of the piezoelectric/electrostrictive bodies of said piezoelectric/electrostrictive elements, having said electrodes formed thereon are such that the amount of crystal grains suffering a transgranular fracture is less than 1%.

5. A matrix type piezoelectric/electrostrictive actuator according to claim 1, wherein the degree of profile of the surfaces of the piezoelectric/electrostrictive bodies in said piezoelectric/electrostrictive elements is approximately 8 $\mu$m or less.

6. A matrix type piezoelectric/electrostrictive actuator according to claim 1, wherein the surface roughness Rt of the side surfaces of the piezoelectric/electrostrictive bodies in said piezoelectric/electrostrictive elements is approximately 10 $\mu$m or less.

7. A matrix type piezoelectric/electrostrictive actuator according to claim 1, wherein said piezoelectric/electrostrictive elements are formed on said ceramic substrate by alternately laminating a plurality of stratiform piezoelectric/electrostrictive bodies, and a plurality of stratiform electrodes.

8. A matrix type piezoelectric/electrostrictive actuator according to claim 1, wherein said piezoelectric/electrostrictive elements are expanded/contracted in a vertical direction to said upper surface plane of said ceramic substrate in the displacement of said piezoelectric/electrostrictive bodies due to a longitudinal effect of the electric field induced strain.

9. A matrix type piezoelectric/electrostrictive actuator according to claim 7, wherein a thickness per layer of said piezoelectric/electrostrictive body in said piezoelectric/electrostrictive elements is 100 $\mu$m or less.

10. A matrix type piezoelectric/electrostrictive actuator according to claim 7, wherein a number of layers being composed of said piezoelectric/electrostrictive body in said piezoelectric/electrostrictive elements is 10 to 200.

11. A matrix type piezoelectric/electrostrictive actuator according to claim 1, wherein a wall portion is formed between the adjacent piezoelectric/electrostrictive elements.

12. A matrix type piezoelectric/electrostrictive actuator according to claim 1, wherein said piezoelectric/electrostrictive body is formed from a material selected from the group consisting of piezoelectric ceramics, electrostrictive ceramics, and antiferroelectric ceramics and a composite material of at least one of said ceramic materials and a piezoelectric polymer.

13. A matrix type piezoelectric/electrostrictive actuator according to claim 1, wherein said ceramic substrate and said piezoelectric/electrostrictive elements are made of the same material.

14. A matrix type piezoelectric/electrostrictive actuator according to claim 1, wherein electrode terminals are disposed on a surface of said ceramic substrate that is opposite to said upper surface plane on which said piezoelectric/electrostrictive elements are arranged, and said electrodes and said electrode terminals are wired to each other via through holes or via holes formed in said ceramic substrate.

* * * * *

UNITED STATES PATENT AND TRADEMARK OFFICE
CERTIFICATE OF CORRECTION

PATENT NO. : 6,864,620 B2
DATED : March 8, 2005
INVENTOR(S) : Yukihisa Takeuchi et al.

It is certified that error appears in the above-identified patent and that said Letters Patent is hereby corrected as shown below:

Title page,
Item [57], ABSTRACT,
Line 1, please change "(PIE)" to -- (P/E) --
Line 5, please add -- the -- after "activated by"

Column 1,
Line 15, please change "PE" to -- P/E --

Column 6,
Line 11, please delete second occurrence of "the"

Column 34,
Line 43, please delete "," and add -- and not on an internal surface therein, wherein a final step in the process for forming -- before "said side…"
Line 44, please delete "being formed as sintered surfaces" and add -- is a sintering step --
Line 45, please delete "and"
Line 46, please delete "that is" and add -- , and said side surfaces of said piezoelectric/ electrostrictive body are --
Line 65, please add -- in -- before "the displacement"

Column 35,
Line 4, please delete ","

Signed and Sealed this

Twenty-fourth Day of May, 2005

JON W. DUDAS
*Director of the United States Patent and Trademark Office*